(12) United States Patent
Kamimura et al.

(10) Patent No.: US 10,948,373 B2
(45) Date of Patent: Mar. 16, 2021

(54) PRESSURE SENSOR DEVICE AND ELECTRICALLY POWERED PUMP

(71) Applicant: Nidec Tosok Corporation, Zama (JP)

(72) Inventors: Yoshihiro Kamimura, Nagaoka (JP); Yoshiyuki Kobayashi, Zama (JP); Shigehiro Kataoka, Zama (JP)

(73) Assignee: NIDEC TOSOK CORPORATION, Kanagawa (JP)

( * ) Notice: Subject to any disclaimer, the term of this patent is extended or adjusted under 35 U.S.C. 154(b) by 76 days.

(21) Appl. No.: 16/320,126

(22) PCT Filed: Jul. 25, 2017

(86) PCT No.: PCT/JP2017/026811
§ 371 (c)(1),
(2) Date: Jan. 24, 2019

(87) PCT Pub. No.: WO2018/021280
PCT Pub. Date: Feb. 1, 2018

(65) Prior Publication Data
US 2019/0265120 A1    Aug. 29, 2019

(30) Foreign Application Priority Data

Jul. 27, 2016 (JP) .............................. JP2016-147531

(51) Int. Cl.
*G01L 19/14* (2006.01)
*G01L 19/00* (2006.01)
(Continued)

(52) U.S. Cl.
CPC .............. *G01L 19/147* (2013.01); *F04C 2/10* (2013.01); *F04C 15/00* (2013.01);
(Continued)

(58) Field of Classification Search
CPC ..... G01L 19/147; G01L 19/14; G01L 19/0084; F04C 15/00; F04C 2/10; H05K 9/0039
See application file for complete search history.

(56) References Cited

U.S. PATENT DOCUMENTS

| 4,881,410 | A | * | 11/1989 | Wise | ................. | A61B 5/02158 |
|---|---|---|---|---|---|---|
| | | | | | | 73/724 |
| 5,120,201 | A | | 6/1992 | Tuckey et al. | | |

(Continued)

FOREIGN PATENT DOCUMENTS

| JP | 04-287886 A | 10/1992 |
|---|---|---|
| JP | 2004-245599 A | 9/2004 |

(Continued)

OTHER PUBLICATIONS

Official Communication issued in International Patent Application No. PCT/JP2017/026811, dated Aug. 22, 2017.

*Primary Examiner* — Peter J Bertheaud
*Assistant Examiner* — Dnyanesh G Kasture
(74) *Attorney, Agent, or Firm* — Keating & Bennett

(57) ABSTRACT

A sensor case of pressure sensor device includes a sensor housing portion, a first terminal housing portion that extends from the sensor housing portion in a first direction, and a second terminal housing portion that extends from the sensor housing portion in a second direction. The first terminal housing portion includes a first upper-side opening that opens upward, and a first lower-side opening that opens downward. The second terminal housing portion includes a second upper-side opening that opens upward, and a second lower-side opening that opens downward. A first terminal includes a first exposed portion including an upper surface exposed to outside of the first terminal housing portion through the first upper-side opening and a lower surface exposed to outside of the first terminal housing portion through the first lower-side opening. A second terminal (Continued)

includes a second exposed portion including an upper surface exposed to outside of the second terminal housing portion through the second upper-side opening and a lower surface exposed to outside of the second terminal housing portion through the second lower-side opening. The first exposed portion includes a first lead wire connection portion to which a first lead wire is connected. The second exposed portion includes a second lead wire connection portion to which a second lead wire is connected.

11 Claims, 13 Drawing Sheets

(51) Int. Cl.
*H05K 9/00* (2006.01)
*F04C 15/00* (2006.01)
*F04C 2/10* (2006.01)

(52) U.S. Cl.
CPC .......... *G01L 19/0084* (2013.01); *G01L 19/14* (2013.01); *H05K 9/0039* (2013.01)

(56) References Cited

U.S. PATENT DOCUMENTS

| | | | |
|---|---|---|---|
| 6,389,903 B1 * | 5/2002 | Oba | .................... G01L 19/0084 439/628 |
| 7,036,385 B2 | 5/2006 | Murai | |
| 8,272,272 B2 | 9/2012 | Gebauer et al. | |
| 2016/0169763 A1 | 6/2016 | Vaupel et al. | |
| 2017/0321794 A1 * | 11/2017 | Kiehlneker | ......... F16H 57/0434 |

FOREIGN PATENT DOCUMENTS

| | | |
|---|---|---|
| JP | 2005-265667 A | 9/2005 |
| JP | 2011-510276 A | 3/2011 |
| JP | 2014-211391 A | 11/2014 |
| JP | 2015-083940 A | 4/2015 |

\* cited by examiner

PRESSURE SENSOR DEVICE AND ELECTRICALLY POWERED PUMP

BACKGROUND OF THE INVENTION

1. Field of the Invention

The present invention relates to a pressure sensor device and an electrically powered pump.

2. Description of the Related Art

A pressure sensor to measure a pressure of a fluid is known. For example, in Japanese Patent Laid-Open No. 2004-245599, a pressure sensor attached to a fluid piping is described.

Incidentally, a configuration in which, when a pressure of a fluid inside an electrically powered pump is measured using a pressure sensor, the pressure sensor is disposed in the electrically powered pump is conceivable. However, there is a problem of the size of the electrically powered pump becoming larger due to the pressure sensor simply being disposed in the electrically powered pump as shown in Japanese Patent Laid-Open No. 2004-245599.

SUMMARY OF THE INVENTION

Exemplary embodiments of the present disclosure provide pressure sensor devices for electrically powered pumps to prevent the size of the electrically powered pumps from becoming larger, and also provide electrically powered pumps including pressure sensor devices.

A pressure sensor device for an electrically powered pump according to an exemplary embodiment of the present disclosure includes a pressure sensor to measure a pressure of a fluid inside the electrically powered pump; a first terminal that projects from the pressure sensor in a first direction that extends to one side in a horizontal direction; a second terminal that projects from the pressure sensor in a second direction that extends to the other side in the horizontal direction; a sensor case that houses the pressure sensor; a first lead wire that is electrically connected to the first terminal; and a second lead wire that is electrically connected to the second terminal, wherein the sensor case includes a sensor housing portion that houses the pressure sensor, a first terminal housing portion that extends from the sensor housing portion in the first direction and houses the first terminal, a second terminal housing portion that extends from the sensor housing portion in the second direction and houses the second terminal, wherein the first terminal housing portion includes a first upper side opening that opens to the upper side and a first lower side opening that opens to the lower side, the second terminal housing portion includes a second upper side opening that opens to the upper side and a second lower side opening that opens to the lower side, the first terminal includes a first exposed portion including an upper surface exposed to the outside of the first terminal housing portion through the first upper side opening and a lower surface exposed to the outside of the first terminal housing portion through the first lower side opening, the second terminal includes a second exposed portion including an upper surface exposed to the outside of the second terminal housing portion through the second upper side opening and a lower surface exposed to outside of the second terminal housing portion through the second lower side opening, the first exposed portion includes a first lead wire connection portion to which the first lead wire is connected, and the second exposed portion includes a second lead wire connection portion to which the second lead wire is connected.

An electrically powered pump according to an exemplary embodiment of the present disclosure includes a shaft that rotates around a central axis; a motor that rotates the shaft; and a pump that is connected to the shaft and driven via the shaft that is rotated by the motor, wherein the electrically powered pump further includes a pressure sensor device according to an exemplary embodiment of the present disclosure, the first terminal is disposed on one side of the pressure sensor in a circumferential direction, the second terminal is disposed on the other side of the pressure sensor in the circumferential direction, and the pressure sensor device is disposed in the electrically powered pump.

According to exemplary embodiments of the present disclosure, there are provided pressure sensor devices for electrically powered pumps that prevent the size of the electrically powered pumps from becoming larger, and electrically powered pumps including such pressure sensor devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
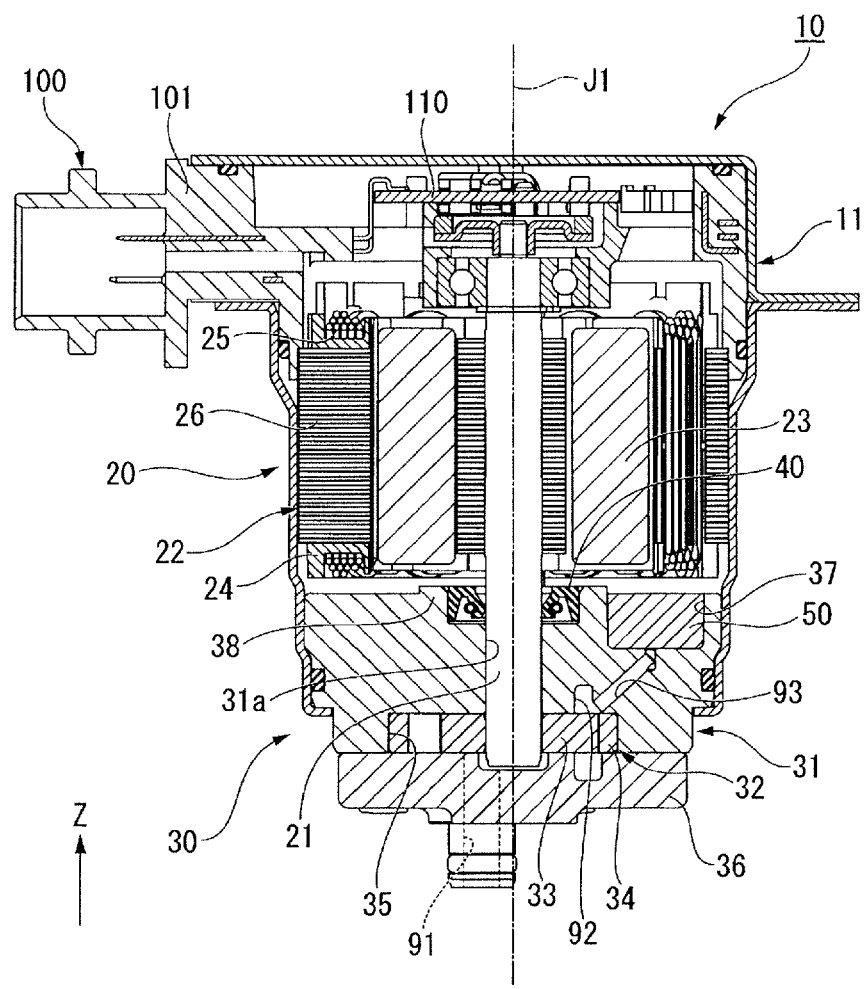
FIG. 1 is a cross-sectional view showing an electrically powered pump of an exemplary embodiment of the present disclosure.

An electrically powered pump 10 of the present embodiment is an electric oil pump that pressurizes and circulates oil as a fluid. As shown in FIG. 1, the electrically powered pump 10 includes a case 11 that houses and holds respective parts of the electrically powered pump 10, a shaft 21 that rotates around a central axis J1, a motor 20 that rotates the shaft 21, a pump 30 that is driven via the shaft 21 that is rotated by the motor 20, a bus bar unit 100, a circuit board 110, and a pressure sensor device 50. The pressure sensor device 50 is schematically shown in FIG. 1.

The central axis J1 extends in a vertical direction. In the following description, unless otherwise noted, a direction parallel to an axial direction of the central axis J1 will be simply referred to as a "vertical direction," a radial direction around the central axis J1 will be simply referred to as a "radial direction," and a circumferential direction around the central axis J1 will be simply referred to as a "circumferential direction." In the drawings, appropriately, the Z axis extends in a direction parallel to the vertical direction, the positive side on the Z axis is referred to as the "upper side," and the negative side on the Z axis is referred to as the "lower side." Here, the vertical direction, the upper side, and the lower side are terms that are simply used for explanation, and do not limit actual positional relationships and directions.

The motor 20 includes a rotor 23 and a stator 22. The rotor 23 is fixed to the outer circumferential surface of the shaft 21. The stator 22 is disposed outward from the rotor 23 in the radial direction and surrounds the rotor 23. The stator 22 includes a stator core 26, an insulator 24 attached to the stator core 26, and a plurality of coils 25 attached to the stator core 26 with the insulator 24 therebetween.

The pump 30 is connected to the shaft 21. In the present embodiment, the pump 30 is positioned on one side of the motor 20 in the vertical direction. In FIG. 1, the pump 30 is positioned below the motor 20. The pump 30 includes a pump body 31, a pump gear 32, and a pump cover 36. The pump body 31 is disposed below the motor 20 so that it faces the motor 20 in the axial direction with a gap therebetween. The pump body 31 has a pump chamber 35 in which the pump gear 32 recessed from the lower side surface to the upper side is housed. Although not shown, the shape of the pump chamber 35 when viewed in the vertical direction is a circular shape. The pump body 31 has a through-hole 31a. The through-hole 31a opens at both ends in the vertical direction and the lower side opening opens to the pump chamber 35. The shaft 21 passes through the through-hole 31a.

Figure 2:
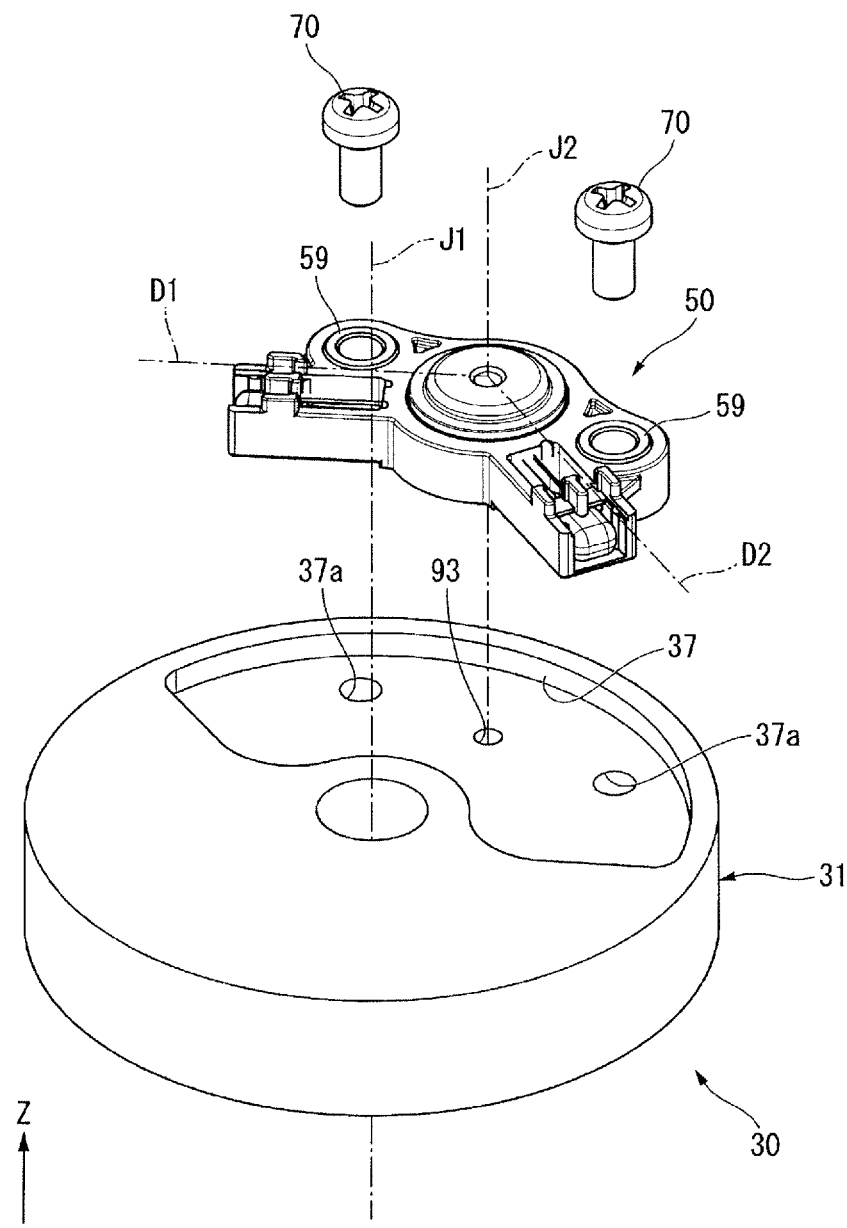
FIG. 2 is an exploded perspective view showing a pressure sensor device and a pump body of an exemplary embodiment of the present disclosure.
Figure 3:
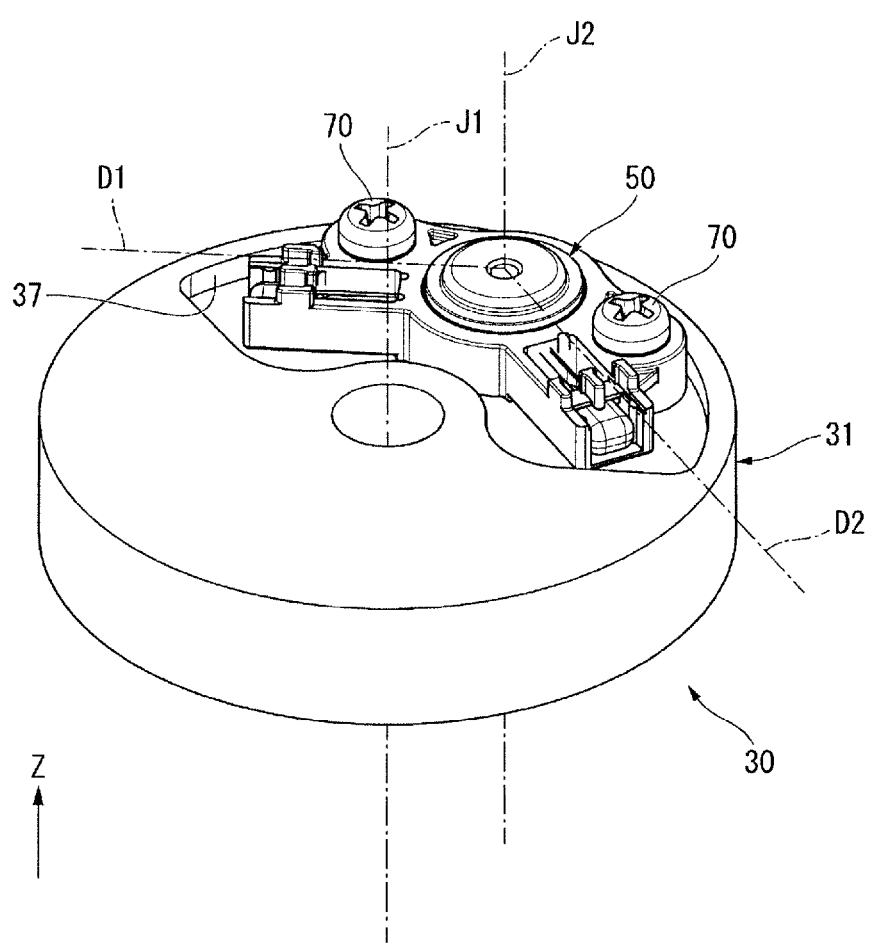
FIG. 3 is a perspective view showing a pressure sensor device and a pump body of an exemplary embodiment of the present disclosure.

The pump body 31 has a sensor housing recess 37 that is recessed from the upper side surface to the lower side. The sensor housing recess 37 is disposed outward from the through-hole 31a in the radial direction. As shown in FIG. 2, the sensor housing recess 37 has an arc shape that extends in the circumferential direction. On the bottom of the sensor housing recess 37, two female screw holes 37a recessed downward are provided. Here, the sensor housing recess 37 may have an annular shape that extends over one circumference in the circumferential direction. In FIG. 2 and FIG. 3, the pump body 31 is shown in a simplified manner.

As shown in FIG. 1, the pump body 31 has a seal holding part 38 at its center. The seal holding part 38 has a cylindrical shape that opens to the upper side. The seal holding part 38 is disposed inside the sensor housing recess 37 in the radial direction. An oil seal 40 is held inside the seal holding part 38. The inside of the seal holding part 38 communicates with the through-hole 31a. The shaft 21 passes through the inside of the seal holding part 38.

The pump gear 32 rotates according to rotation of the shaft 21. In the present embodiment, the pump gear 32 is attached to the lower end of the shaft 21. The pump gear 32 has an inner rotor 33 fixed to the outer circumferential surface at the lower end of the shaft 21 and an outer rotor 34 that surrounds the outside of the inner rotor 33 in the radial direction. Here, the inner rotor 33 and the shaft 21 may be in a state in which a relative rotation around the central axis J1 is allowed to some extent. The pump cover 36 is attached to the lower side of the pump body 31. The pump cover 36 has a lid shape that extends in the radial direction. The pump cover 36 blocks the lower side opening of the pump chamber 35.

The pump 30 includes an introduction oil path 91, a discharge oil path 92, and a detection oil path 93. In FIG. 1, the introduction oil path 91 is provided in the pump cover 36. The introduction oil path 91 is an oil path which is connected to the pump chamber 35 and introduces oil into the pump chamber 35. In FIG. 1, the discharge oil path 92 is provided in the pump body 31. The discharge oil path 92 is an oil path which is connected to the pump chamber 35 and discharges oil from the pump chamber 35. The detection oil path 93 is an oil path which is provided in the pump body 31 and connects the discharge oil path 92 and the sensor housing recess 37. In FIG. 1, the detection oil path 93 extends radially outward and obliquely upward from the discharge oil path 92. As shown in FIG. 2, the upper end of the detection oil path 93 opens to the bottom of the sensor housing recess 37. A position at which the detection oil path 93 opens at the bottom of the sensor housing recess 37 is, for example, the center between the two female screw holes 37a in the circumferential direction.

As shown in FIG. 1, the bus bar unit 100 is disposed above the motor 20. The bus bar unit 100 includes a bus bar electrically connected to the stator 22, a bus bar electrically connected to the circuit board 110, and a cylindrical bus bar holder 101 that holds each bus bar. The circuit board 110 is held by the bus bar holder 101 inside the bus bar holder 101 in the radial direction. Although not shown, the pressure sensor device 50 is electrically connected to the circuit board 110.

The pressure sensor device 50 is a pressure sensor device for the electrically powered pump 10, and is disposed in the electrically powered pump 10. As shown in FIG. 1 and FIG. 3, the pressure sensor device 50 is housed in the sensor housing recess and is fixed to the pump body 31. A method of fixing the pressure sensor device 50 is not particularly limited. In FIG. 3, the pressure sensor device 50 is fixed to the pump body 31 with two screws 70 fastened to the female screw holes 37a shown in FIG. 2.

Figure 4:
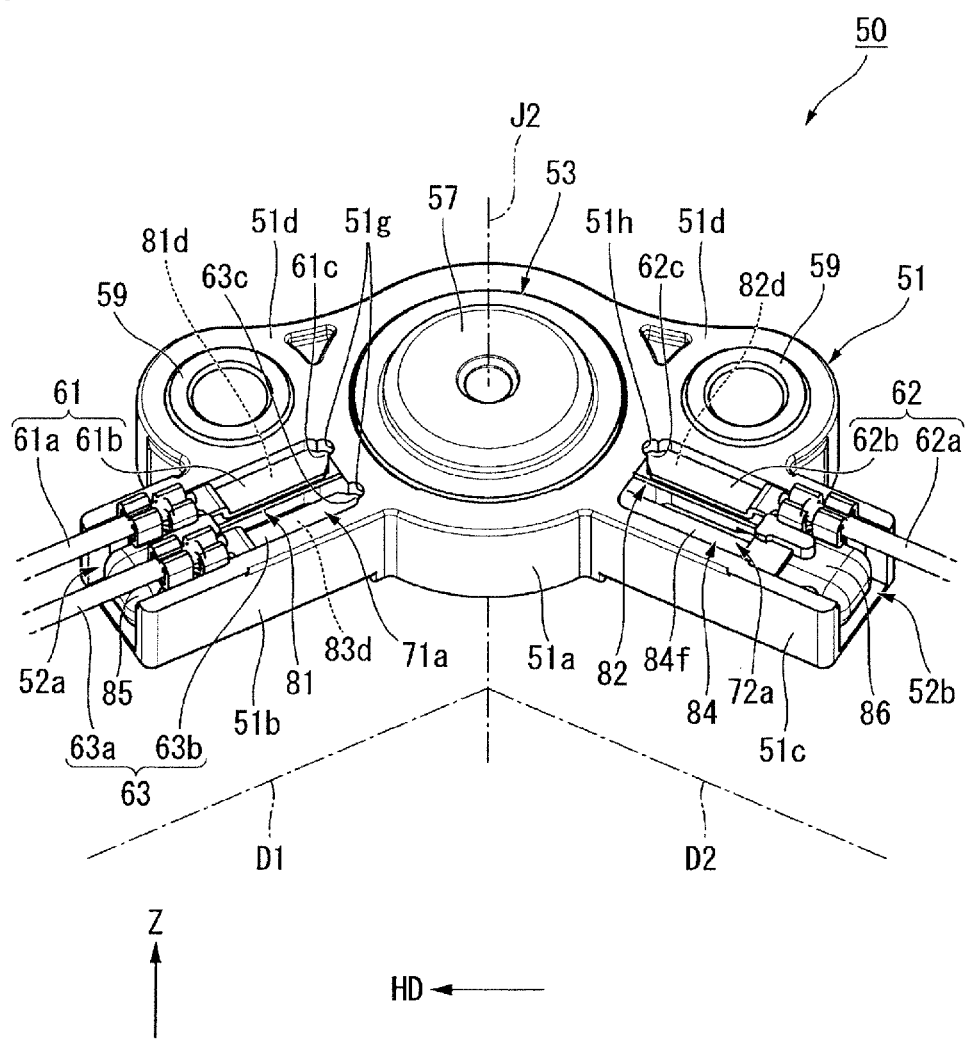
FIG. 4 is a perspective view showing a pressure sensor device of an exemplary embodiment of the present disclosure.
Figure 5:
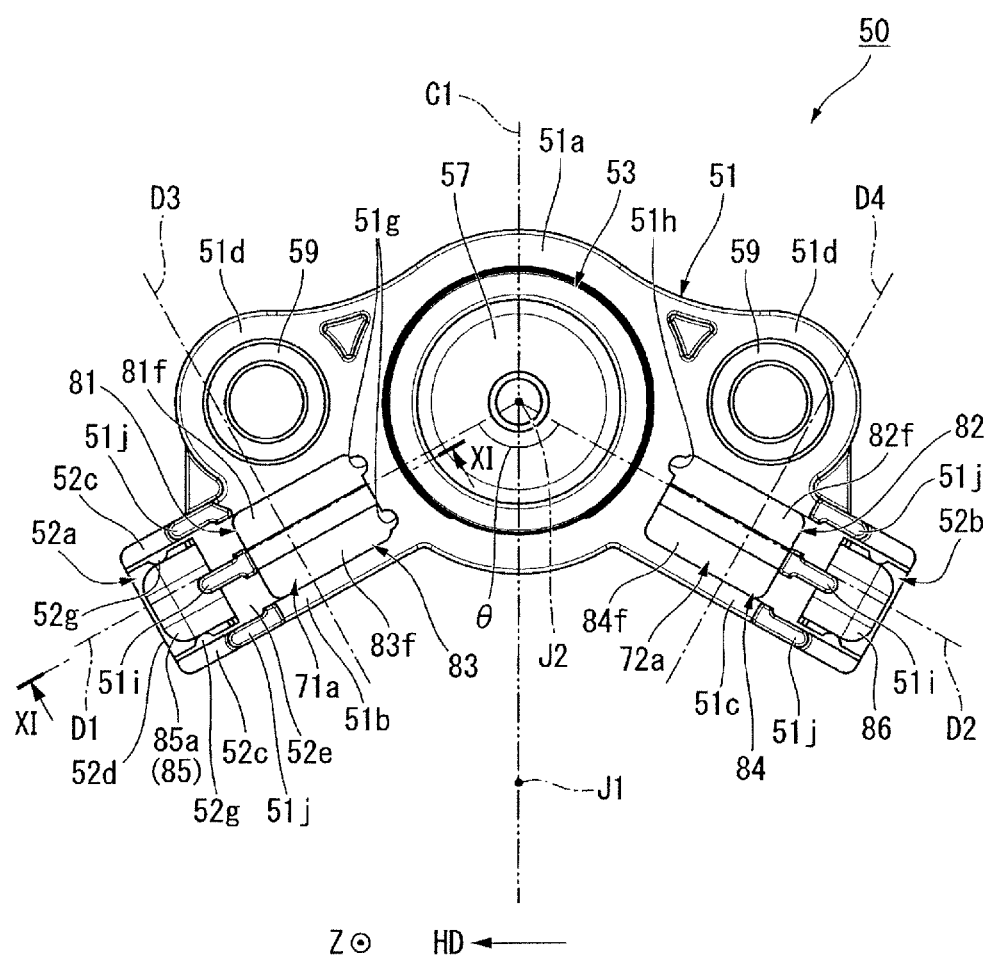
FIG. 5 is a plan view showing a pressure sensor device of an exemplary embodiment of the present disclosure.
Figure 6:
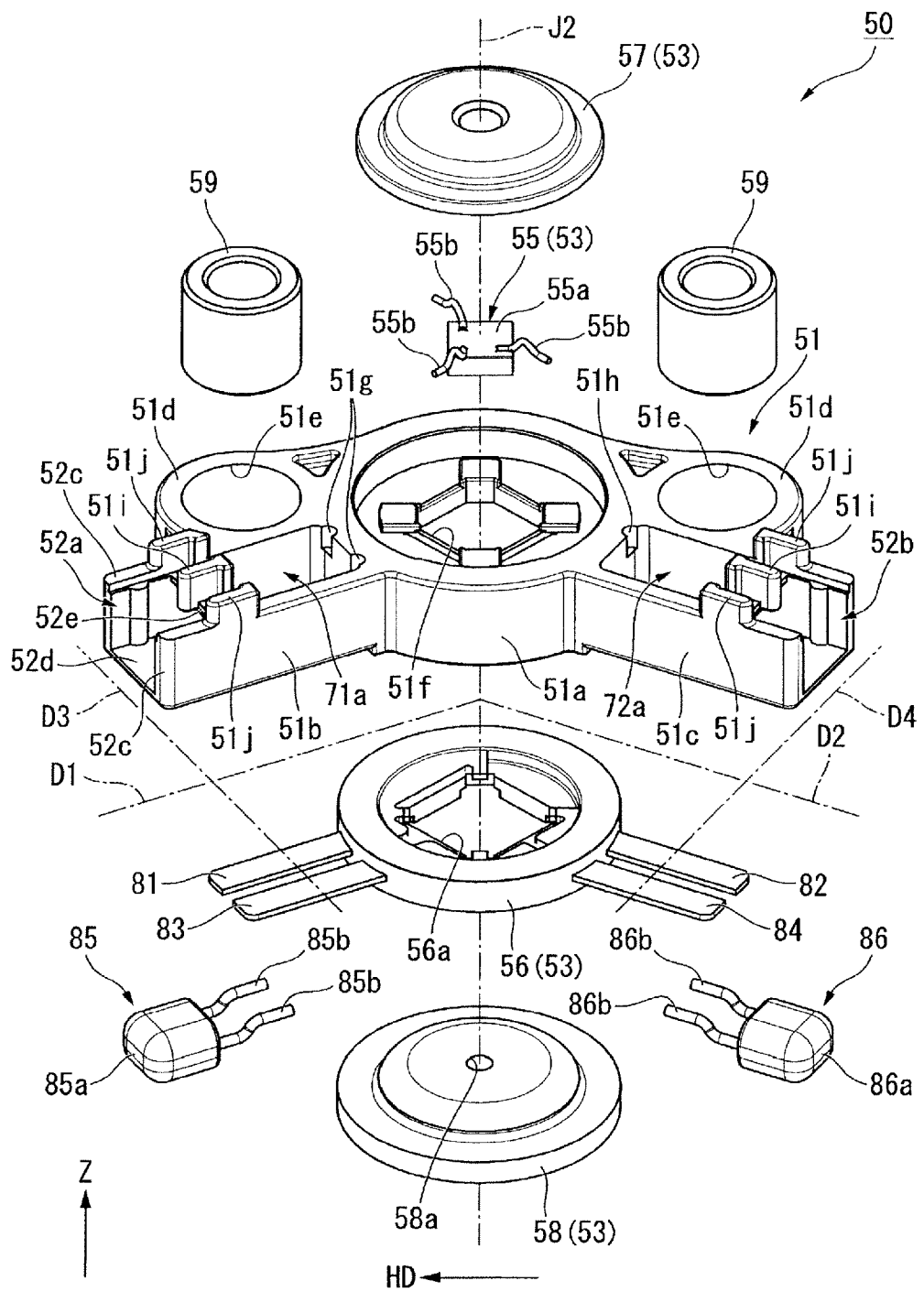
FIG. 6 is an exploded perspective view showing a pressure sensor device of an exemplary embodiment of the present disclosure.

As shown in FIG. 4 to FIG. 6, the pressure sensor device 50 has a flat shape with a relatively small size in the vertical direction. The pressure sensor device 50 includes a pressure sensor 53, a sensor case 51, a first terminal 81, a second terminal 82, a third terminal 83, a fourth terminal 84, a first lead wire 61, a second lead wire 62, a third lead wire 63, a first capacitor 85, and a second capacitor 86. The sensor case 51 houses the pressure sensor 53, the first terminal 81, the second terminal 82, the third terminal 83, the fourth terminal 84, the first capacitor 85, and the second capacitor 86.

Figure 7:
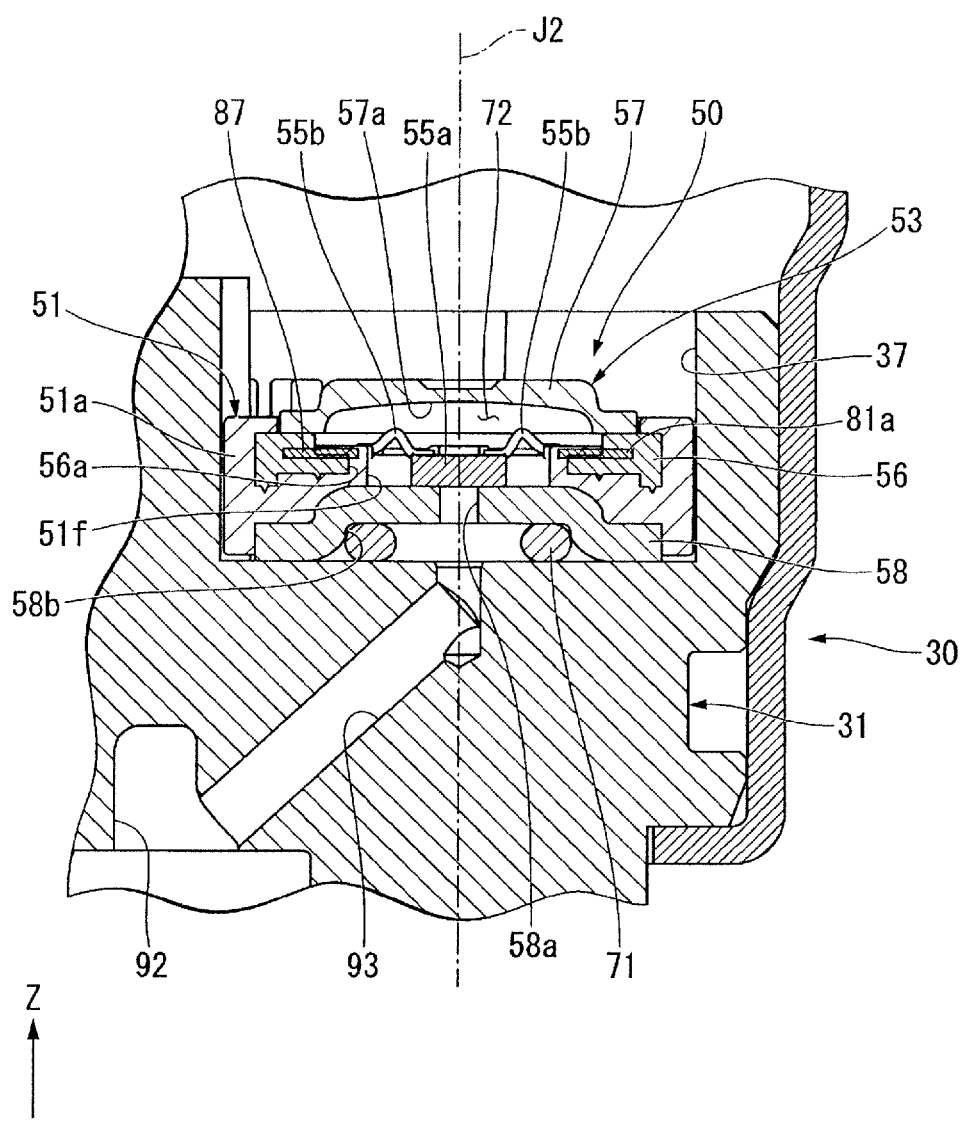
FIG. 7 is a cross-sectional view showing a pressure sensor device of an exemplary embodiment of the present disclosure and a partially enlarged view of FIG. 1.

The pressure sensor 53 measures a pressure of a fluid inside the electrically powered pump 10, that is, oil in the present embodiment. The pressure sensor 53 has a flat cylindrical shape in which a sensor central axis J2 passes through its center. The sensor central axis J2 is parallel to the central axis J1 and extends in the vertical direction. As shown in FIG. 2 and FIG. 3, the sensor central axis J2 is disposed away from the central axis J1 in the radial direction. The sensor central axis J2 is positioned at the center of the sensor housing recess 37 in the radial direction. As shown in FIG. 7, the pressure sensor 53 is partially embedded and held in the sensor housing portion 51*a* (to be described below) of the sensor case 51.

As shown in FIG. 6, the pressure sensor 53 includes a terminal support 56, a sensor chip 55, an upper side cover 57, and a lower side cover 58. The terminal support 56 has an annular shape in which the sensor central axis J2 passes through its center. The terminal support 56 has a support through-hole 56*a* that penetrates the center of the terminal support 56 in the vertical direction. The shape of the support through-hole 56*a* when viewed from the upper side is a substantially square shape. The terminal support 56 supports the first terminal 81, the second terminal 82, the third terminal 83, and the fourth terminal 84. As shown in FIG. 7, the terminal support 56 is embedded in a sensor housing portion 51*a* (to be described below) of the sensor case 51.

Figure 8:
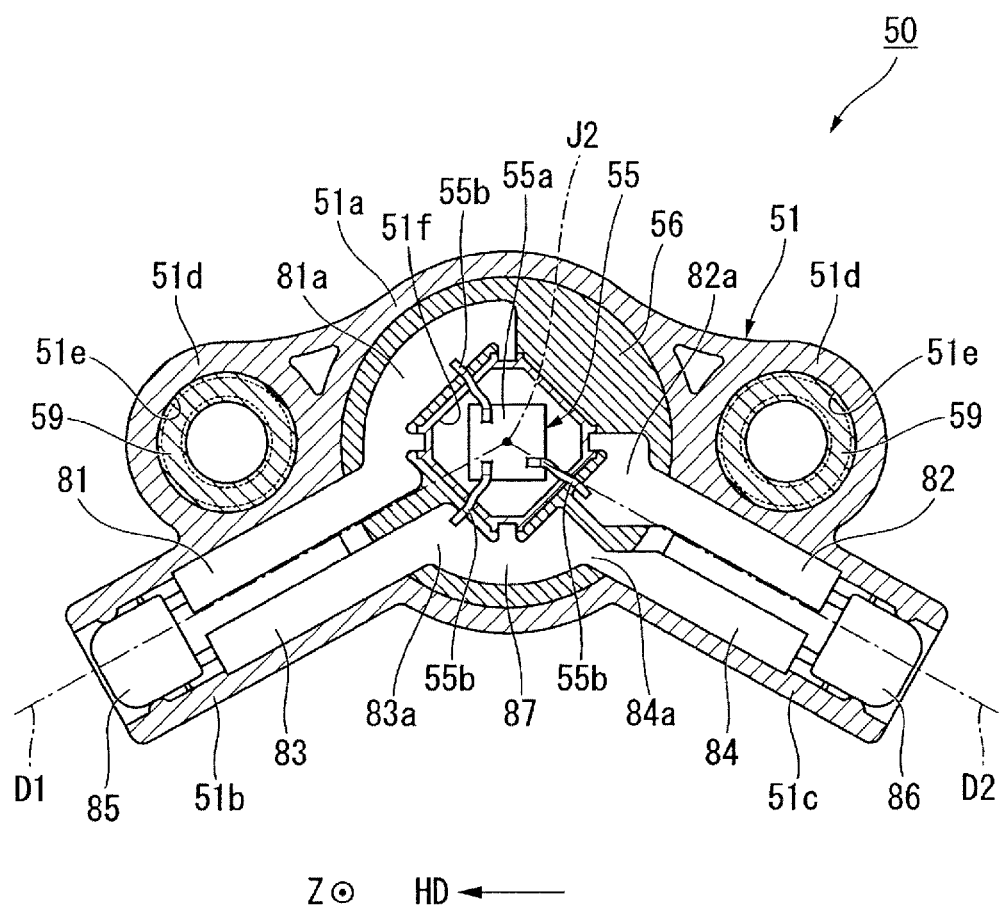
FIG. 8 is a cross-sectional view of a pressure sensor device of an exemplary embodiment of the present disclosure when viewed from the upper side.

As shown in FIG. 6, the sensor chip 55 includes a square plate type sensor chip main body 55*a*, and three chip terminals 55*b* that are electrically connected to the upper surface of the sensor chip main body 55*a*. As shown in FIG. 7, the sensor chip main body 55*a* is disposed inside the support through-hole 56*a*. The sensor chip main body 55*a* is disposed on the upper surface of the lower side cover 58. In FIG. 7, the sensor chip main body 55*a* blocks an upper end opening of a detection hole 58*a* (to be described below). As shown in FIG. 8, the three chip terminals 55*b* are electrically connected to the first terminal 81, the second terminal 82, the third terminal 83 and the fourth terminal 84. Here, a material such as aluminum can be wire-bonded to form a chip terminal, and electrodes of the sensor chip 55 and the terminals 81 to 84 can be electrically connected.

As shown in FIG. 7, the upper side cover 57 is disposed above the sensor chip 55. The upper side cover 57 covers the upper side of the sensor chip 55. As shown in FIG. 6, the upper side cover 57 has a disc shape in which the sensor central axis J2 passes through its center. As shown in FIG. 7, the upper side cover 57 has an upper side recess 57*a* that is recesses from the center of the lower surface to the upper side. An outer circumferential edge part on the lower surface of the upper side cover 57 is in contact with the upper surface of the terminal support 56.

Figure 9:
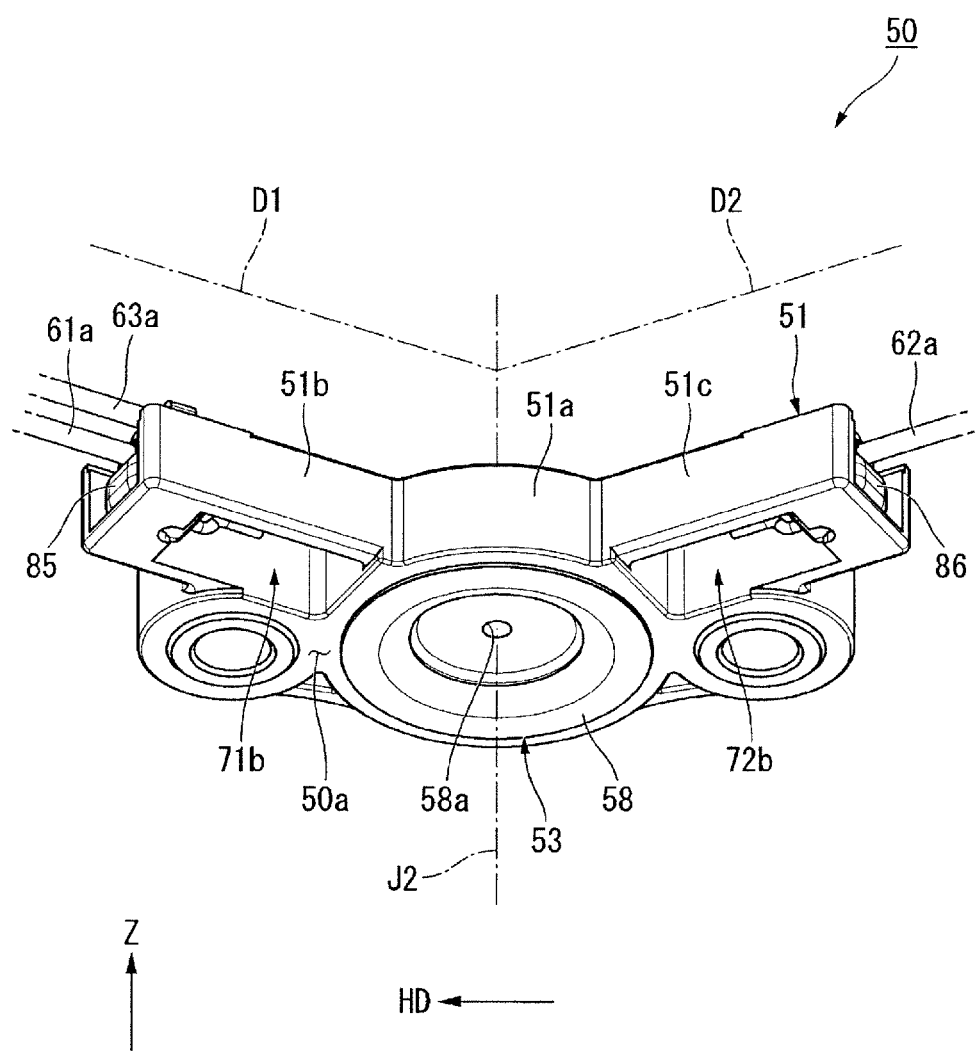
FIG. 9 is a perspective view showing a pressure sensor device of an exemplary embodiment of the present disclosure.

The lower side cover 58 is disposed below the sensor chip 55. As shown in FIG. 6, the lower side cover 58 has a disc shape in which the sensor central axis J2 passes through its center. As shown in FIG. 7, the lower side cover 58 includes the detection hole 58*a* that penetrates the lower side cover 58 in the vertical direction and a lower side recess 58*b* that is recessed from the center of the lower surface to the upper side. The lower end of the detection hole 58*a* opens into the lower side recess 58*b*. The upper end of the detection hole 58*a* is blocked by the sensor chip main body 55*a* as described above. As shown in FIG. 6, the shape of the detection hole 58*a* in a plan view is a circular shape in which the sensor central axis J2 passes through its center. As shown in FIG. 9, the shape of the lower side recess 58*b* when viewed from the lower side is a circular shape in which the sensor central axis J2 passes through its center.

As shown in FIG. 7, while the pressure sensor device 50 is fixed into the sensor housing recess 37, an outer circumferential edge part of the lower side recess 58*b* within the lower surface of the lower side cover 58 comes in contact with the bottom of the sensor housing recess 37. An O-ring 71 is disposed inside the lower side recess 58*b*. The O-ring 71 has an annular shape along the inner circumferential edge of the lower side recess 58*b*. The O-ring 71 comes in contact with the bottom of the sensor housing recess 37 and the top surface of the lower side recess 58*b* and seals a gap between the lower side cover 58 and the pump body 31. The upper end of the detection oil path opens to the inside of the lower side recess 58*b*.

As shown in FIG. 6, the first terminal 81 to the fourth terminal 84 are flat plates orthogonal to the vertical direction. In the first terminal 81 to the fourth terminal 84, the inner end in the radial direction around the sensor central axis J2 is embedded and fixed to the inside of the pressure sensor 53. As shown in FIG. 5 and FIG. 8, the first terminal 81 and the third terminal 83 project in a first direction D1 that extends from the pressure sensor 53 to one side in the horizontal direction. The second terminal 82 and the fourth terminal 84 project in a second direction D2 that extends to the other side in the horizontal direction. More specifically, as shown in FIG. 6, the first terminal 81 and the third terminal 83 project from the terminal support 56 in the first direction D1. The second terminal 82 and the fourth terminal 84 project from the terminal support 56 in the second direction D2.

As shown in FIG. 5, the first terminal 81 and the third terminal 83 are disposed side by side in a third direction D3 orthogonal to both the first direction D1 and the vertical direction. The second terminal 82 and the fourth terminal 84 are disposed side by side in a fourth direction D4 orthogonal to both the second direction D2 and the vertical direction. The first terminal 81, the second terminal 82, the third terminal 83, and the fourth terminal 84 are disposed on the same horizontal plane orthogonal to the vertical direction in which the plate surface is parallel to the horizontal plane orthogonal to the vertical direction.

Here, in the present embodiment, the horizontal direction is, for example, a horizontal direction HD orthogonal to an imaginary line C1 connecting the central axis J1 and the sensor central axis J2 in a plan view shown in FIG. 5, that is, a left to right direction in FIG. 5. In the present embodiment, one side in the horizontal direction is the positive side (+HD side) in the horizontal direction HD, that is, the left side in FIG. 5, and the other side in the horizontal direction is the negative side (−HD side) in the horizontal direction HD, that is, the right side in FIG. 5.

In addition, in the present embodiment, the first direction D1 that extends to one side in the horizontal direction is one of a plurality of horizontal directions orthogonal to the vertical direction, and is one of directions that extend from the sensor central axis J2 which is the center of the pressure sensor 53 to an area on the right side (+HD side) of the imaginary line C1. In FIG. 5, the first direction D1 extends from the sensor central axis J2 to the left side inclined toward the central axis J1 (the lower side in FIG. 5) with respect to the horizontal direction HD orthogonal to the imaginary line C1. The first direction D1 is one of radial directions around the sensor central axis J2.

In addition, in the present embodiment, the second direction D2 that extends to the other side in the horizontal direction is one of a plurality of horizontal directions orthogonal to the vertical direction and one of directions that extend from the sensor central axis J2 which is the center of the pressure sensor 53 to an area on the right side (−HD side) of the imaginary line C1. In FIG. 5, the second direction D2 extends from the sensor central axis J2 to the right side inclined toward the central axis J1 (the lower side in FIG. 5) with respect to the horizontal direction HD orthogonal to the imaginary line C1. The second direction D2 is one of radial directions around the sensor central axis J2. An angle θ formed by the first direction D1 and the second direction D2 is an obtuse angle.

Here, in the following description, a side in the first direction D1 that is closer to the sensor central axis J2 with respect to a certain object will be referred to as the "inner side in the first direction" and a side away from the sensor central axis J2 with respect to a certain object will be referred to as the "outer side in the first direction." In addition, a side in the second direction D2 closer to the sensor central axis J2 with respect to a certain object will be referred to as the "inner side in the second direction" and a side away from the sensor central axis J2 with respect to a certain object will be referred to as the "outer side in the second direction."

As shown in FIG. 8, almost all of a first supported part 81a which is a part of the first terminal 81 on the inner side in the first direction is embedded in the terminal support 56 and supported by the terminal support 56. The first supported part 81a extends in the circumferential direction around the sensor central axis J2. An inner edge part of the upper surface of the first supported part 81a in the radial direction around the sensor central axis J2 is exposed from the terminal support 56. One of the chip terminals 55b is electrically connected to the exposed portion of the upper surface of the first supported part 81a.

Almost all of a second supported part 82a which is an end of the second terminal 82 on the inner side in the second direction is embedded in the terminal support 56 and supported by the terminal support 56. An inner edge part of the upper surface of the second supported part 82a in the radial direction around the sensor central axis J2 is exposed from the terminal support 56. One of the chip terminals 55b different from the chip terminal 55b connected to the first supported part 81a among the chip terminals 55b is connected to the exposed portion of the upper surface of the second supported part 82a.

Almost all of a third supported part 83a which is an end of the third terminal 83 on the inner side in the first direction is embedded in the terminal support 56 and supported by the terminal support 56. An inner edge part of the upper surface of the third supported part 83a in the radial direction around the sensor central axis J2 is exposed from the terminal support 56. The remaining one of the chip terminals 55b different from the chip terminal 55b connected to the first supported part 81a and the chip terminal 55b connected to the second supported part 82a among the chip terminals 55b is connected to the exposed portion of the upper surface of the third supported part 83a.

Almost all of a fourth supported part 84a which is an end of the fourth terminal 84 on the inner side in the second direction is embedded in the terminal support 56 and supported by the terminal support 56. An inner edge part of the upper surface of the fourth supported part 84a in the radial direction around the sensor central axis J2 is exposed from the terminal support 56. The fourth terminal 84 is electrically connected to the third terminal 83. More specifically, the third supported part 83a and the fourth supported part 84a are connected with a connection portion 87 therebetween, and thus the third terminal 83 and the fourth terminal 84 are electrically connected. The fourth terminal 84 is electrically connected to the third terminal 83 and thus electrically connected to the chip terminal 55b connected to the third terminal 83.

The connection portion 87 extends in the circumferential direction around the sensor central axis J2. In the present embodiment, the third terminal 83, the fourth terminal 84, and the connection portion 87 are made of the same member. The first terminal 81, the second terminal 82, and the third terminal 83 are disposed apart from and insulated from one another. The first terminal 81, the second terminal 82, and the fourth terminal 84 are disposed apart from and insulated from one another.

As shown in FIG. 5, the first terminal 81 and the third terminal 83 are disposed on one side of the pressure sensor 53 in the circumferential direction. The second terminal 82 and the fourth terminal 84 are disposed on the other side of the pressure sensor 53 in the circumferential direction. In the present embodiment, one side of the pressure sensor 53 in the circumferential direction is a side that moves counterclockwise around the central axis J1 from the pressure sensor 53 when viewed from the upper side. The other side of the pressure sensor 53 in the circumferential direction is a side that moves clockwise around the central axis J1 from the pressure sensor 53 when viewed from the upper side.

As shown in FIG. 4, the first lead wire 61 is electrically connected to the first terminal 81. The first lead wire 61 includes a first lead wire main body 61a and a first connection metal fitting 61b. The first connection metal fitting 61b is fixed to the tip of the first lead wire main body 61a. The first connection metal fitting 61b has a plate shape that extends in the first direction D1 and is orthogonal to the vertical direction. The first connection metal fitting 61b is fixed to the upper surface of the first terminal 81. More specifically, the first connection metal fitting 61b is connected to a first lead wire connection portion 81d (to be described below). The first connection metal fitting 61b has the side of the pressure sensor 53 in the first direction D1, that is, a first convex part 61c that projects to the inner side in the first direction. The first lead wire main body 61a is electrically connected to the first terminal 81 with the first connection metal fitting 61b therebetween.

The second lead wire 62 is electrically connected to the second terminal 82. The second lead wire 62 includes a second lead wire main body 62a and a second connection metal fitting 62b. The second connection metal fitting 62b is fixed to the tip of the second lead wire main body 62a. The second connection metal fitting 62b has a plate shape that extends in the second direction D2 and is orthogonal to the vertical direction. The second connection metal fitting 62b is fixed to the upper surface of the second terminal 82. More specifically, the second connection metal fitting 62b is connected to a second lead wire connection portion 82d (to be described below). The second connection metal fitting 62b has the side of the pressure sensor 53 in the second direction D2, that is, a second convex part 62c that projects to the inner side in the second direction. The second lead wire main body 62a is electrically connected to the second terminal 82 with the second connection metal fitting 62b therebetween.

The third lead wire 63 is electrically connected to the third terminal 83. The third lead wire 63 includes a third lead wire main body 63a and a third connection metal fitting 63b. The third connection metal fitting 63b is fixed to the tip of the third lead wire main body 63a. The third connection metal fitting 63b has a plate shape that extends in the first direction D1 and is orthogonal to the vertical direction. The third connection metal fitting 63b is fixed to the upper surface of the third terminal 83. More specifically, the third connection metal fitting 63b is connected to a third lead wire connection portion 83d (to be described below). The third connection metal fitting 63b has the side of the pressure sensor 53 in the first direction D1, that is, a third convex part 63c that projects to the inner side in the first direction. The third lead wire main body 63a is electrically connected to the third terminal 83 with the third connection metal fitting 63b therebetween.

Each of the lead wires is any of a power supply lead wire for supplying power to the pressure sensor device 50, a ground lead wire for grounding the pressure sensor device 50, and an output lead wire for outputting a value of a pressure measured by the pressure sensor device 50 as an electrical signal. As an example, the first lead wire 61 is a power supply lead wire. The second lead wire 62 is an output lead wire. The third lead wire 63 is a ground lead wire.

As described above, according to the present embodiment, the first terminal 81 and the second terminal 82 extend from the pressure sensor 53 in the first direction D1 and the second direction D2 which are one of the horizontal directions. Therefore, the pressure sensor device 50 can be made small in the vertical direction. In addition, the first terminal 81 and the second terminal 82 project from the pressure sensor 53 in the first direction D1 and the second direction D2 toward the sides that are opposite to each other in the horizontal direction. Therefore, compared to when the first terminal 81 and the second terminal 82 are disposed to project in the same direction, the pressure sensor device 50 can be made smaller in the vertical direction and the radial direction. Therefore, according to the present embodiment, the pressure sensor device 50 can be made small both in the vertical direction and the radial direction, and can be formed into a flat and elongated shape as a whole. Therefore, if the pressure sensor device 50 is disposed in the electrically powered pump 10 in the circumferential direction of the central axis J1, when the pressure sensor device 50 is disposed in the electrically powered pump 10, it is possible to prevent the size of the electrically powered pump 10 from becoming larger.

Specifically, as in the present embodiment, when the first terminal 81 is disposed on one side of the pressure sensor 53 in the circumferential direction, and the second terminal 82 is disposed on the other side of the pressure sensor 53 in the circumferential direction, the pressure sensor device 50 can be disposed in the circumferential direction. Thereby, it is possible to prevent the size of the electrically powered pump 10 from becoming larger and it is possible to dispose the pressure sensor device 50 in the electrically powered pump 10. In particular, as in the present embodiment, when an angle θ formed by the first direction D1 and the second direction D2 is an obtuse angle, the shape of the entire pressure sensor device 50 can be easily similar to the shape in the circumferential direction and the pressure sensor device 50 is easily disposed in the sensor housing recess 37 that extends in the circumferential direction. Thereby, it is possible to prevent the size of the electrically powered pump 10 from becoming larger.

In the present embodiment, as described above, in addition to the first terminal 81 and the second terminal 82, the third terminal 83 and the fourth terminal 84 are provided. Thus, the first terminal 81 and the third terminal 83 project in the first direction D1, and the second terminal 82 and the fourth terminal 84 project in the second direction D2. Therefore, even if four terminals are provided, the pressure sensor device 50 can be made small both in the vertical direction and the radial direction, and it is possible to prevent the size of the electrically powered pump 10 from becoming larger.

The first capacitor 85 is disposed on one side (+HD side) of the pressure sensor 53 in the horizontal direction and is connected between the first terminal 81 and the third terminal 83. The second capacitor 86 is disposed on the other side (−HD side) of the pressure sensor 53 in the horizontal direction and is connected between the second terminal 82 and the fourth terminal 84. In this manner, the first capacitor 85 and the second capacitor 86 can be disposed on the sides that are opposite to each other in the horizontal direction with respect to the pressure sensor 53 by projecting four terminals two at a time in the first direction D1 and the second direction D2. Therefore, compared to when the first capacitor 85 and the second capacitor 86 are disposed on the same side of the pressure sensor 53, the pressure sensor device 50 can be made smaller in the vertical direction and the radial direction. In addition, the first capacitor 85 and the second capacitor 86 can prevent generation of a surge current.

As shown in FIG. 6, the first capacitor 85 includes a first capacitor main body 85a and two first connection terminals 85b. The first capacitor main body 85a is disposed on an extension line of the first terminal 81 and the third terminal 83 in the first direction D1. The two first connection terminals 85b extend from the first capacitor main body 85a to the inner side in the first direction. The two first connection terminals 85b are disposed side by side in the third direction D3.

The second capacitor 86 includes a second capacitor main body 86a and two second connection terminals 86b. The second capacitor main body 86a is disposed on an extension line of the second terminal 82 and the fourth terminal 84 in the second direction D2. The two second connection terminals 86b extend from the second capacitor main body 86a to the inner side in the second direction. The two second connection terminals 86b are disposed side by side in the fourth direction D4.

Figure 10:
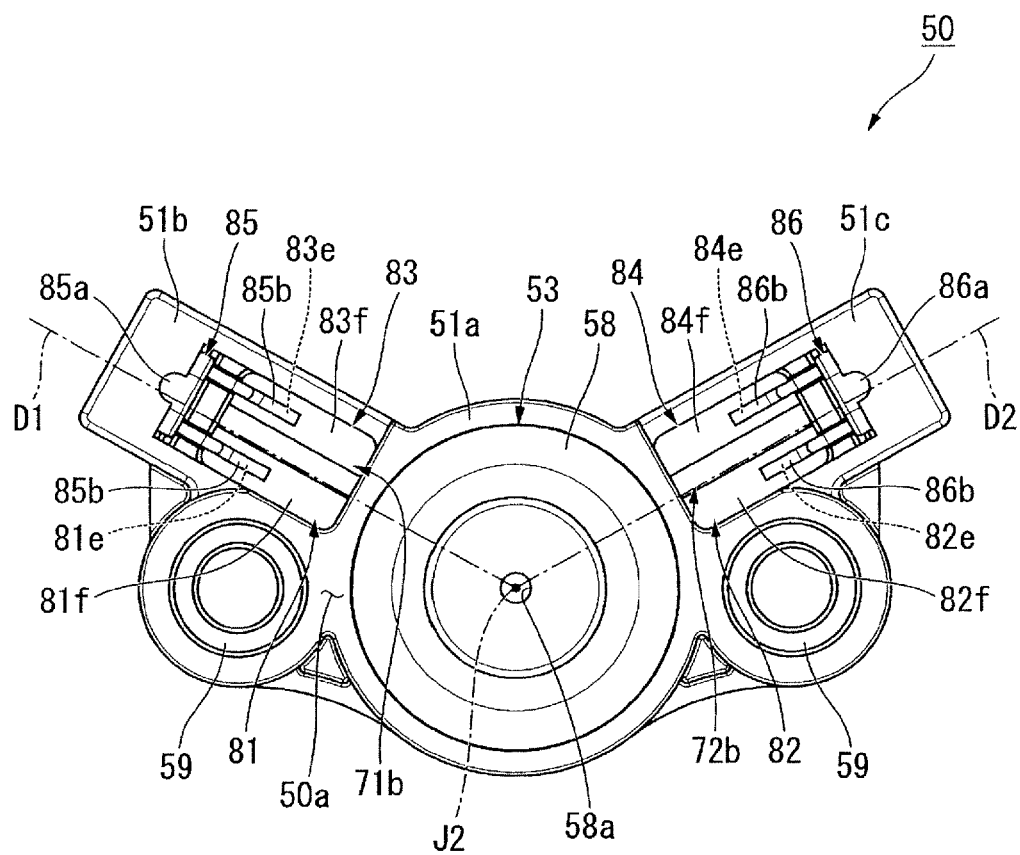
FIG. 10 is a bottom view showing a pressure sensor device of an exemplary embodiment of the present disclosure.

As shown in FIG. 10, one of the two first connection terminals 85b is connected to an end of the lower surface of the first terminal 81 on the outer side in the first direction. The other of the two first connection terminals 85b is connected to an end of the lower surface of the third terminal 83 on the outer side in the first direction. Thereby, the first capacitor 85 is connected between the first terminal 81 and the third terminal 83.

One of the two second connection terminals 86b is connected to an end of the lower surface of the second terminal 82 on the outer side in the second direction. The other of the two second connection terminals 86b is connected to an end of the lower surface of the fourth terminal 84 on the outer side in the second direction. Thereby, the second capacitor 86 is connected between the second terminal 82 and the fourth terminal 84.

Figure 11:
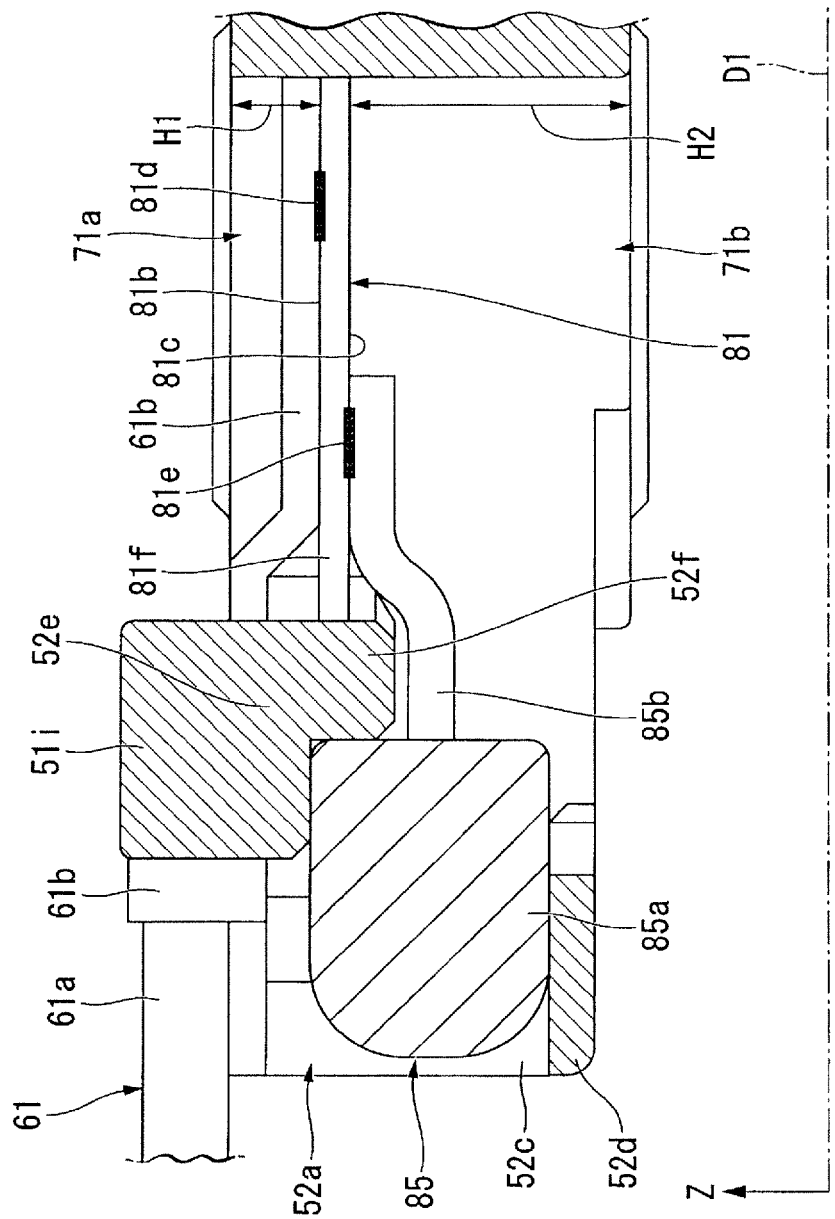
FIG. 11 is a diagram showing a portion of a pressure sensor device of an exemplary embodiment of the present disclosure and is a cross-sectional view taken along the line XI-XI in FIG. 5.

As shown in FIG. 11, the upper end of the first capacitor main body 85a is disposed at substantially the same position as the upper surface of the first terminal 81 in the vertical direction. Although not shown, the upper end of the second capacitor main body 86a is disposed at substantially the same position as the upper surface of the second terminal 82 in the vertical direction.

As shown in FIG. 6, the sensor case 51 has the sensor housing portion 51a, a first terminal housing portion 51b, a second terminal housing portion 51c, and a pair of fixing parts 51d. The sensor housing portion 51a has a substantially cylindrical shape centered on the sensor central axis J2. The sensor housing portion 51a houses the pressure sensor 53. More specifically, as shown in FIG. 7, a part of the pressure sensor 53 is embedded and held in the sensor housing portion 51a. The sensor housing portion 51a has a housing portion through-hole 51f that penetrates the center of the sensor housing portion 51a in the vertical direction. As shown in FIG. 8, the shape of the housing portion through-hole 51f when viewed from the upper side is a substantially square shape in which the sensor central axis J2 passes through its center. The sensor chip main body 55a is disposed inside the housing portion through-hole 51f in the radial direction around the sensor central axis J2.

As shown in FIG. 7, the lower side cover 58 is embedded and held in a lower part of the sensor housing portion 51a. The lower surface of the lower side cover 58 is exposed from the sensor housing portion 51a. The upper surface of the lower side cover 58 covers the lower end of the housing portion through-hole 51f. The terminal support 56 is embedded and held in an upper part of the sensor housing portion 51a.

The upper surface of the lower side cover 58, the inner surface of the sensor housing portion 51a, the inner surface of the terminal support 56, and the lower surface of the upper side cover 57 constitute a housing space 72 in which the sensor chip 55 is housed. Although not shown, a sealing component covering the sensor chip 55 is disposed in the housing space 72.

As shown in FIG. 4 and FIG. 5, the first terminal housing portion 51b extends from the sensor housing portion 51a in the first direction D1. The first terminal housing portion 51b has a rectangular box shape that is long in the first direction D1. The first terminal housing portion 51b houses the first terminal 81, the third terminal 83, and the first capacitor 85.

As shown in FIG. 6 and FIG. 9, the first terminal housing portion 51b has a first upper side opening 71a that opens to the upper side and a first lower side opening 71b that opens to the lower side. The shape of the first upper side opening 71a and the first lower side opening 71b when viewed in the vertical direction is a rectangular shape that is long in the first direction D1. The first upper side opening 71a and the first lower side opening 71b are disposed in an overlapping manner in the vertical direction. In the present embodiment, the first upper side opening 71a and the first lower side opening 71b communicate with each other, and constitute a through-hole that penetrates the first terminal housing portion 51b in the vertical direction. As shown in FIG. 11, a distance H2 from the lower end of the first lower side opening 71b to a lower surface 81c of a first exposed portion 81f in the vertical direction is larger than a distance H1 from the upper end of the first upper side opening 71a to an upper surface 81b of the first exposed portion 81f in the vertical direction.

As shown in FIG. 5 and FIG. 10, when the first upper side opening 71a and the first lower side opening 71b are provided, a part of the first terminal 81 and a part of the third terminal 83 are exposed to the outside of the first terminal housing portion 51b. That is, the first terminal 81 has the first exposed portion 81f. The third terminal 83 has a third exposed portion 83f. As shown in FIG. 5, the upper surface of the first exposed portion 81f is exposed to the outside of the first terminal housing portion 51b through the first upper side opening 71a, and as shown in FIG. 10, the lower surface thereof is exposed to the outside of the first terminal housing portion 51b through the first lower side opening 71b. As shown in FIG. 5, the upper surface of the third exposed portion 83f is exposed to the outside of the first terminal housing portion 51b through the first upper side opening 71a, and as shown in FIG. 10, the lower surface thereof is exposed to the outside of the first terminal housing portion 51b through the first lower side opening 71b.

As shown in FIG. 4 and FIG. 5, the second terminal housing portion 51c extends from the sensor housing portion 51a in the second direction D2. The second terminal housing portion 51c has a rectangular box shape that is long in the second direction D2. The second terminal housing portion 51c houses the second terminal 82, the fourth terminal 84, and the second capacitor 86.

As shown in FIG. 6 and FIG. 9, the second terminal housing portion 51c has a second upper side opening 72a that opens to the upper side and a second lower side opening 72b that opens to the lower side. The shape of the second upper side opening 72a and the second lower side opening 72b when viewed in the vertical direction is a rectangular shape that is long in the second direction D2. The second upper side opening 72a and the second lower side opening 72b are disposed in an overlapping manner in the vertical direction. In the present embodiment, the second upper side opening 72a and the second lower side opening 72b communicate with each other and constitute a through-hole that penetrates the second terminal housing portion 51c in the vertical direction. Although not shown, a distance from the lower end of the second lower side opening 72b to the lower surface of a second exposed portion 82f in the vertical direction is larger than a distance from the upper end of the second upper side opening 72a to the upper surface of the second exposed portion 82f in the vertical direction.

As shown in FIG. 5 and FIG. 10, when the second upper side opening 72a and the second lower side opening 72b are provided, a part of the second terminal 82 and a part of the fourth terminal are exposed to the outside of the second terminal housing portion 51c. That is, the second terminal 82 has the second exposed portion 82f. The fourth terminal 84 has a fourth exposed portion 84f. As shown in FIG. 5, the upper surface of the second exposed portion 82f is exposed to the outside of the second terminal housing portion 51c through the second upper side opening 72a, and as shown in FIG. 10, the lower surface thereof is exposed to the outside of the second terminal housing portion 51c through the second lower side opening 72b. As shown in FIG. 5, the upper surface of the fourth exposed portion 84f is exposed to the outside of the second terminal housing portion 51c through the second upper side opening 72a, and as shown in FIG. 10, the lower surface thereof is exposed to the outside of the second terminal housing portion 51c through the second lower side opening 72b.

In the present embodiment, only one first upper side opening 71a and only one first lower side opening 71b are provided. Thereby, the upper surface of the first exposed portion 81f and the upper surface of the third exposed portion 83f are exposed through one first upper side opening 71a. The lower surface of the first exposed portion 81f and the lower surface of the third exposed portion 83f are exposed through one first lower side opening 71b. Therefore, it is easy to increase the size of the first upper side opening 71a and the size of the first lower side opening 71b and electrodes EP1 and EP2 are easily inserted into openings during resistance welding (to be described below). Thereby, it is easy to perform resistance welding.

In the present embodiment, only one second upper side opening 72a and only one second lower side opening 72b are provided. Thereby, the upper surface of the second exposed portion 82f and the upper surface of the fourth exposed portion 84f are exposed through one second upper side opening 72a. The lower surface of the second exposed portion 82f and the lower surface of the fourth exposed portion 84f are exposed through one second lower side opening 72b. Therefore, it is easy to increase the size of the second upper side opening 72a and the size of the second lower side opening 72b and the electrodes EP1 and EP2 are easily inserted into openings during resistance welding (to be described below). Thereby, it is easy to perform resistance welding.

As shown in FIG. 4, the first exposed portion 81f has the first lead wire connection portion 81d to which the first lead wire 61 is connected. As shown in FIG. 11, in the present embodiment, the first lead wire connection portion 81d is provided on the upper surface 81b of the first exposed portion 81f. As shown in FIG. 10, the first exposed portion 81f has a first capacitor connection portion 81e to which the first capacitor 85 is connected. One of the first connection terminals 85b is connected to the first capacitor connection portion 81e. As shown in FIG. 11, in the present embodiment, the first capacitor connection portion 81e is provided on the lower surface 81c of the first exposed portion 81f. That is, the first lead wire connection portion 81d is provided on one of the upper surface 81b of the first exposed portion 81f and the lower surface 81c of the first exposed portion 81f, and the first capacitor connection portion 81e is provided on the other of the upper surface 81b of the first exposed portion 81f and the lower surface 81c of the first exposed portion 81f. The first capacitor connection portion 81e is disposed at a position different from that of the first lead wire connection portion 81d in the first direction D1. The first lead wire connection portion 81d is disposed on the side of the pressure sensor 53 in the first direction D1 with respect to the first capacitor connection portion 81e, that is, on the inner side in the first direction.

As shown in FIG. 4, the second exposed portion 82f has the second lead wire connection portion 82d to which the second lead wire 62 is connected. In the present embodiment, the second lead wire connection portion 82d is provided on the upper surface of the second exposed portion 82f. As shown in FIG. 10, the second exposed portion 82f has a second capacitor connection portion 82e to which the second capacitor 86 is connected. One of the second connection terminals 86b is connected to the second capacitor connection portion 82e. In the present embodiment, the second capacitor connection portion 82e is provided on the lower surface of the second exposed portion 82f. Although not shown, the second capacitor connection portion 82e is disposed at a position different from that of the second lead wire connection portion 82d in the second direction D2. The second lead wire connection portion 82d is disposed on the side of the pressure sensor 53 in the second direction D2 with respect to the second capacitor connection portion 82e, that is, on the inner side in the second direction.

As shown in FIG. 4, the third exposed portion 83f has the third lead wire connection portion 83d to which the third lead wire 63 is connected. In the present embodiment, the third lead wire connection portion 83d is provided on the upper surface of the third exposed portion 83f. As shown in FIG. 10, the third exposed portion 83f has a third capacitor connection portion 83e to which the first capacitor 85 is connected. The other of the first connection terminals 85b is connected to the third capacitor connection portion 83e. In the present embodiment, the third capacitor connection portion 83e is provided on the lower surface of the third exposed portion 83f. Although not shown, the third lead wire connection portion 83d is disposed on the side of the pressure sensor 53 in the first direction D1 with respect to the third capacitor connection portion 83e, that is, on the inner side in the first direction.

The fourth exposed portion 84f has a fourth capacitor connection portion 84e to which the second capacitor 86 is connected. The other of the second connection terminals 86b is connected to the fourth capacitor connection portion 84e.

In the present embodiment, the lead wires and the capacitors are connected to the exposed portions using resistance welding. That is, in the present embodiment, the lead wire connection portions and the capacitor connection portions are parts formed using resistance welding. The resistance welding is a connection method in which two metal members to be welded are interposed between the electrodes EP1 and EP2 shown in FIG. 12 and FIG. 13, a current is applied to the electrodes EP1 and EP2 while applying a pressurization force, and thus metal members are melted and bonded with heat generated according to contact resistance. According to the resistance welding, since two metal members can be easily connected, it is possible to easily assemble the pressure sensor device 50 and it is possible to improve the productivity of the pressure sensor device 50.

A method of connecting lead wires and capacitors to exposed portions will be described below. Here, since methods of connecting lead wires and capacitors to exposed portions are the same, in the following description, procedures and actions and effects only when the first lead wire 61 and the first capacitor 85 are connected to the first exposed portion 81f as representative will be described.

Figure 12:
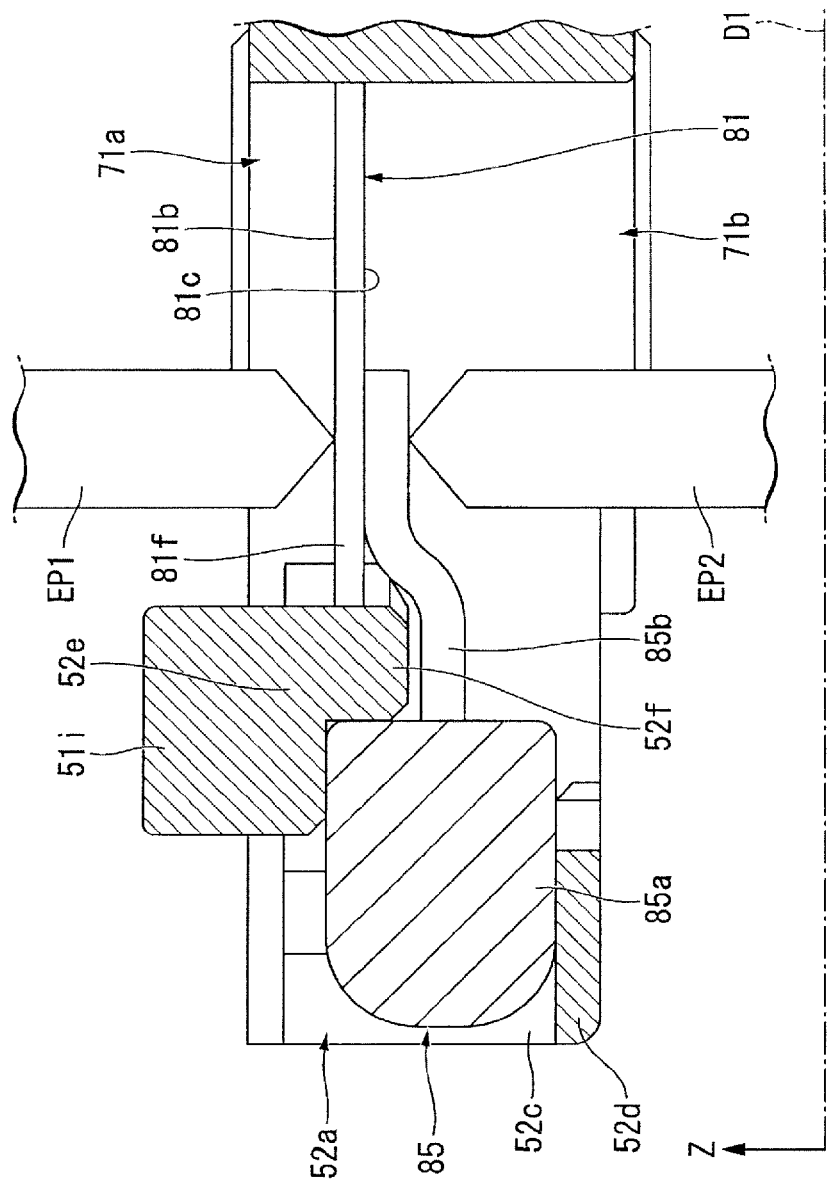
FIG. 12 is a cross-sectional view showing procedures of a method of connecting a first lead wire and a first capacitor in a pressure sensor device of an exemplary embodiment of the present disclosure.
Figure 13:
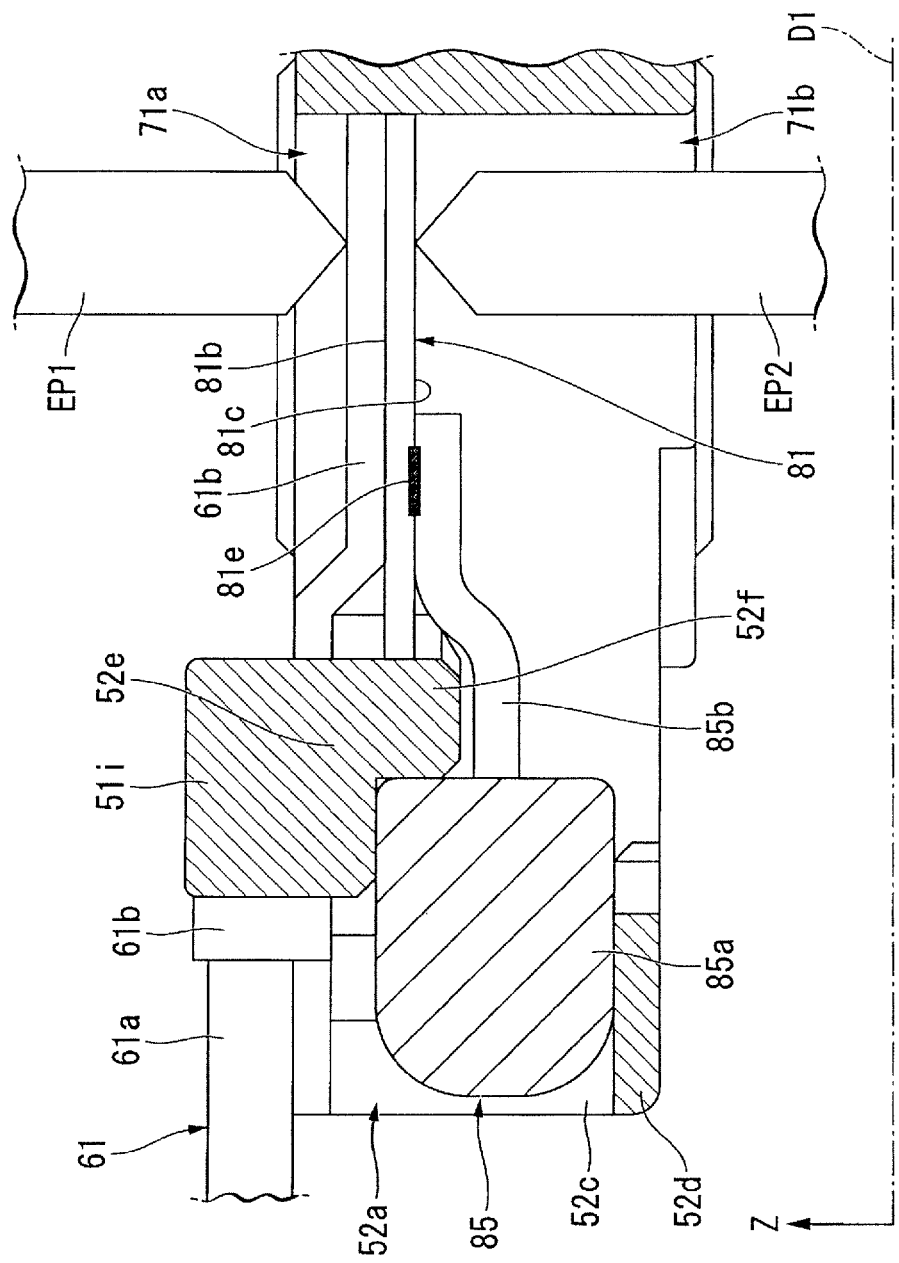
FIG. 13 is a cross-sectional view showing procedures of a method of connecting a first lead wire and a first capacitor in a pressure sensor device of an exemplary embodiment of the present disclosure.

First, as shown in FIG. 12, before the first lead wire 61 is installed, the first connection terminal 85b of the first capacitor 85 is disposed in contact with the lower surface 81c of the first exposed portion 81f. Then, the electrode EP1 is inserted into the first upper side opening 71a and is brought into contact with the upper surface 81b of the first exposed portion 81f, and the electrode EP2 is inserted into the first lower side opening 71b and is brought into contact with the lower end of the first connection terminal 85b. The electrode EP1 and the electrode EP2 are positioned in an overlapping manner in the vertical direction. In this state, when a current is applied to the electrode EP1 and the electrode EP2, heat is generated due to contact resistance at contact parts of the first exposed portion 81f and the first connection terminal 85b, and the contact parts are melted and bonded. Thereby, as shown in FIG. 13, the first capacitor connection portion 81e is formed, and the first terminal 81 and the first capacitor 85 are connected.

Next, the first connection metal fitting 61b is disposed on the upper surface 81b of the first exposed portion 81f in an overlapping manner. Then, the electrode EP1 is inserted into the first upper side opening 71a, and is brought into contact with the upper surface of the first connection metal fitting 61b, and the electrode EP2 is inserted into the first lower side opening 71b and is brought into contact with the lower surface 81c of the first exposed portion 81f. The electrode EP1 and the electrode EP2 are positioned in an overlapping manner in the vertical direction. In this case, the positions of the electrodes EP1 and EP2 in the first direction D1 are positioned on the inner side in the first direction with respect to the first capacitor connection portion 81e. In this state, when a current is applied to the electrode EP1 and the electrode EP2, heat is generated due to contact resistance at contact parts of the first exposed portion 81f and the first connection metal fitting 61b, and the contact parts are melted and bonded. Thereby, the first lead wire connection portion 81d shown in FIG. 11 is formed, and the first terminal 81 and the first lead wire 61 are connected.

As described above, the first lead wire 61 and the first capacitor 85 are connected to the first exposed portion 81f.

According to the present embodiment, since the sensor case 51 has the first terminal housing portion 51b and the second terminal housing portion 51c, the first terminal 81 and the second terminal 82 are covered with the sensor case 51. Therefore, when the pressure sensor device 50 is disposed in the electrically powered pump 10, a part in which the pressure sensor device 50 is installed in the electrically powered pump 10 can be insulated from each terminal. For example, as in the present embodiment, when the pressure sensor device 50 is disposed in the pump body 31, if the pump body 31 is made of a metal, it is necessary to perform insulation between the terminals and the pump body 31. In the present embodiment, when the terminals are housed in the sensor case 51, without separately performing an insulation treatment, the pressure sensor device 50 can be installed in the pump body 31 while performing insulation between the terminal and the pump body 31. Therefore, it is possible to easily install the pressure sensor device 50 and it is possible to easily assemble the electrically powered pump 10. As shown in FIG. 9 and FIG. 10, in the present embodiment, the lower surface of the sensor case 51 has an installation surface 50a in contact with an installation part of the electrically powered pump 10. In the present embodiment, the installation part of the electrically powered pump 10 corresponds to the bottom of the sensor housing recess 37 in the pump body 31. That is, the installation surface 50a comes in contact with the bottom of the sensor housing recess 37.

In addition, the first terminal housing portion 51b has the first upper side opening 71a and the first lower side opening 71b, and the first terminal 81 has the first exposed portion 81f of which upper and lower surfaces are exposed through the first upper side opening 71a and the first lower side opening 71b. Therefore, while the first terminal 81 is housed in the sensor case 51, the electrodes EP1 and EP2 are inserted from the first upper side opening 71a and the first lower side opening 71b, and thus the first terminal 81 and the first lead wire 61 can be connected using resistance welding. In addition, the second terminal housing portion 51c has the second upper side opening 72a and the second lower side opening 72b, and the second terminal 82 has the second exposed portion 82f of which upper and lower surfaces are exposed through the second upper side opening 72a and the second lower side opening 72b. Therefore, while the second terminal 82 is housed in the sensor case 51, the electrodes EP1 and EP2 are inserted from the second upper side opening 72a and the second lower side opening 72b, and thus the second terminal 82 and the second lead wire 62 can be connected using resistance welding. Therefore, according to the present embodiment, it is possible to easily insulate the first terminal 81 and the second terminal 82 using the sensor case 51, it is possible to improve assembly efficiency of the pressure sensor device 50, and it is possible to improve the productivity of the pressure sensor device 50.

In addition, in the present embodiment, since the third terminal 83 has the third exposed portion 83f of which upper and lower surfaces are exposed through the first upper side opening 71a and the first lower side opening 71b, the third terminal 83 and the third lead wire 63 can be connected using resistance welding. Thereby, it is possible to further improve assembly efficiency of the pressure sensor device 50 and it is possible to further improve the productivity of the pressure sensor device 50.

In addition, for example, when three overlapping metal members are interposed between the electrodes EP1 and EP2 and is connected using resistance welding, it is not possible to perform connection in some cases due to the difference in the thickness and the electric resistance of the three overlapping metal members and the like. Specifically, there are cases in which only two metal members among three metal members are connected or all of three metal members are not connected.

On the other hand, according to the present embodiment, in the first exposed portion 81f, the first lead wire connection portion 81d and the first capacitor connection portion 81e are dispose at positions different from each other in the first direction D1. Therefore, as described above, after the first exposed portion 81f and the first connection terminal 85b are resistance-welded in an overlapping manner, if the first exposed portion 81f and the first connection metal fitting 61b are resistance-welded in an overlapping manner, it is possible to perform resistance welding while two metal members overlap. Thereby, it is possible to appropriately connect both the first capacitor 85 and the first lead wire 61 to the first exposed portion 81f using resistance welding. In addition, in the third exposed portion 83f, the third lead wire connection portion 83d and the third capacitor connection portion 83e are disposed at positions different from each other in the first direction D1. Therefore, as in the first exposed portion 81f described above, it is possible to appropriately connect both the first capacitor 85 and the third lead wire 63 to the third exposed portion 83f using resistance welding.

In addition, in the present embodiment, in the second exposed portion 82f, the second lead wire connection portion 82d and the second capacitor connection portion 82e are disposed at positions different from each other in the second direction D2. Therefore, as in the first exposed portion 81f described above, it is possible to appropriately connect both the second capacitor 86 and the second lead wire 62 to the second exposed portion 82f using resistance welding.

In addition, according to the present embodiment, the first lead wire connection portion 81d and the first capacitor connection portion 81e are provided on surfaces on the sides opposite to each other on upper and lower surfaces of the first exposed portion 81f. Therefore, when the first lead wire 61 and the first capacitor 85 are sequentially connected to the first exposed portion 81f, members to be connected are unlikely to interfere with each other. Therefore, the first lead wire 61 and the first capacitor 85 are easily connected to the first exposed portion 81f.

In addition, according to the present embodiment, the first lead wire connection portion 81d is disposed on the side of the pressure sensor 53 in the first direction D1 with respect to the first capacitor connection portion 81e. Therefore, as described above, a connection method in which, after the first capacitor 85 is first connected to the first exposed portion 81f, the first lead wire 61 is appropriately connected to the first exposed portion 81f is easily performed, and the first lead wire 61 and the first capacitor 85 are easily appropriately connected to the first exposed portion 81f.

In addition, according to the present embodiment, the first lead wire connection portion 81d is provided on the upper surface 81b of the first exposed portion 81f. Therefore, when the installation surface 50a is brought into contact with the pump body 31 and the pressure sensor device 50 is installed, the first lead wire 61 can be pulled out from the side opposite to the side on which the installation surface 50a is provided, that is, the upper side. Thereby, the first lead wire 61 connected to the first exposed portion 81f is easily wound.

In addition, when resistance welding is performed, a part of a molten material of a metal member to be welded may scatter around. For example, when the scattered molten material adheres to the installation surface 50*a*, before the pressure sensor device 50 is installed, it is necessary to remove the adhered molten material from the installation surface 50*a*, which takes time and effort. On the other hand, according to the present embodiment, the distance H2 from the lower end of the first lower side opening 71*b* to the lower surface 81*c* of the first exposed portion 81*f* in the vertical direction is larger than the distance H1 from the upper end of the first upper side opening 71*a* to the upper surface 81*b* of the first exposed portion 81*f* in the vertical direction. Therefore, within an internal space of the first terminal housing portion 51*b* constituted by the first upper side opening 71*a* and the first lower side opening 71*b*, it is possible to increase the size of a part disposed below the first exposed portion 81*f* in the vertical direction. Thereby, when resistance welding is performed, even if a part of the first exposed portion 81*f* or a part of the first connection terminal 85*b* is melted and scattered, the molten material adheres to the inner surface constituting a space disposed below the first exposed portion 81*f* and is unlikely to reach the installation surface 50*a*. Therefore, it is possible to prevent the molten material from adhering to the installation surface 50*a* and it is possible to reduce time and effort required when the pressure sensor device 50 is installed.

As shown in FIG. 4 and FIG. 5, the first terminal housing portion 51*b* has a first capacitor holding part 52*a* that holds the first capacitor 85. Therefore, when the first capacitor 85 is connected to the first exposed portion 81*f* and the third exposed portion 83*f*, the position of the first capacitor 85 can be fixed. Thereby, the first capacitor 85 is easily connected to the first exposed portion 81*f* and the third exposed portion 83*f*.

The first capacitor holding part 52*a* is an end of the first terminal housing portion 51*b* on the outer side in the first direction. As shown in FIG. 5, FIG. 6 and FIG. 11, the first capacitor holding part 52*a* has a pair of side walls 52*c*, a bottom wall 52*d*, a top wall 52*e*, and a projection part 52*f*. The pair of side walls 52*c* are walls that rise in the vertical direction and extend in the first direction D1. The pair of side walls 52*c* are disposed to face each other with the first capacitor 85 on both sides of the first capacitor 85 in the third direction D3. As shown in FIG. 5, the pair of side walls 52*c* have a capacitor holding convex part 52*g* that projects toward the other side wall 52*c*. The tip of the capacitor holding convex part 52*g* comes in contact with the side surface of the first capacitor main body 85*a* in the third direction D3. That is, the first capacitor main body 85*a* is interposed between both sides in contact with the capacitor holding convex part 52*g* in the third direction D3. Thereby, it is possible to prevent the first capacitor main body 85*a* from moving in the third direction D3.

As shown in FIG. 6, the bottom wall 52*d* connects ends on the outer side in the first direction at the lower end of the pair of side walls 52*c*. As shown in FIG. 11, the upper surface of the bottom wall 52*d* comes in contact with the lower surface of the first capacitor main body 85*a*. The first capacitor main body 85*a* is supported from the lower side by the bottom wall 52*d*. As shown in FIG. 6, the top wall 52*e* connects upper ends of the pair of side walls 52*c*. The top wall 52*e* is disposed at a position on the inner side in the first direction away from an end of the pair of side walls 52*c* on the outer side in the first direction. As shown in FIG. 5, the first upper side opening 71*a* is provided on the inner side of the top wall 52*e* in the first direction. As shown in FIG. 11, the top wall 52*e* is disposed on the inner side in the first direction with respect to the bottom wall 52*d*. Thereby, in a part in which the bottom wall 52*d* is provided, the first capacitor holding part 52*a* opens to the upper side. The lower surface of the top wall 52*e* comes in contact with a part of the upper surface of the first capacitor main body 85*a* on the inner side in the first direction. In this manner, the first capacitor main body 85*a* is interposed between the bottom wall 52*d* and the top wall 52*e* in the vertical direction. Thereby, it is possible to prevent the first capacitor main body 85*a* from moving in the vertical direction.

The projection part 52*f* projects from an end of the lower surface of the top wall 52*e* on the inner side in the first direction to the lower side. An end of the first capacitor main body 85*a* on the inner side in the first direction abuts an end of the projection part 52*f* on the outer side in the first direction from the outer side in the first direction. Thereby, the first capacitor main body 85*a* is positioned in the first direction D1.

As shown in FIG. 4 and FIG. 5, the second terminal housing portion 51*c* has a second capacitor holding part 52*b* that holds the second capacitor 86. Therefore, when the second capacitor 86 is connected to the second exposed portion 82*f* and the fourth exposed portion 84*f*, it is possible to fix the position of the second capacitor 86. Thereby, the second capacitor 86 is easily connected to the second exposed portion 82*f* and the fourth exposed portion 84*f*. The second capacitor holding part 52*b* is an end of the second terminal housing portion 51*c* on the outer side in the second direction. Other configurations of the second capacitor holding part 52*b* are the same as those of the first capacitor holding part 52*a*.

The pair of fixing parts 51*d* project from the sensor housing portion 51*a* to both sides in the horizontal direction HD. A circular fixing hole 51*e* that penetrates the fixing part 51*d* in the vertical direction is provided in the pair of fixing parts 51*d*. As shown in FIG. 8, a cylindrical member 59 is fixed into the fixing hole 51*e*. As shown in FIG. 6, the cylindrical member 59 has a cylindrical shape that opens at both ends in the vertical direction. As shown in FIG. 2 and FIG. 3, the screw 70 for fixing the pressure sensor device 50 to the pump body 31 passes through the inside of the cylindrical member 59 from the upper side and is fastened to the female screw hole 37*a*.

As shown in FIG. 4 and FIG. 5, the sensor case 51 has a first recess 51*g* that is recessed toward the pressure sensor 53 in the first direction D1, that is, to the inner side in the first direction. The first recess 51*g* is provided on the inner surface of the first upper side opening 71*a*. The first recess 51*g* opens to the upper side. In FIG. 4 and FIG. 5, two first recesses 51*g* are provided side by side in the third direction D3. The first convex part 61*c* of the first connection metal fitting 61*b* is inserted into one of the first recesses 51*g*. The third convex part 63*c* of the third connection metal fitting 63*b* is inserted into the other of the first recesses 51*g*. Therefore, the first connection metal fitting 61*b* and the third connection metal fitting 63*b* can be positioned. Thereby, when the first lead wire 61 is connected to the first exposed portion 81*f* and when the third lead wire 63 is connected to the third exposed portion 83*f*, it is possible to prevent the position of the first lead wire 61 and the position of the third lead wire 63 from being shifted. Therefore, the first lead wire 61 is easily connected to the first exposed portion 81*f*, and the third lead wire 63 is easily connected to the third exposed portion 83*f*.

The sensor case 51 has a second recess 51*h* that is recessed toward the pressure sensor 53 in the second direction D2, that is, to the inner side in the second direction. The second recess 51*h* is provided on the inner surface of the second upper side opening 72a. The second recess 51h opens to the upper side. In FIG. 4 and FIG. 5, only one second recess 51h is provided. The second convex part 62c of the second connection metal fitting 62b is inserted into the second recess 51h. Therefore, the second connection metal fitting 62b can be positioned. Thereby, when the second lead wire 62 is connected to the second exposed portion 82f, it is possible to prevent the position of the second lead wire 62 from being shifted. Therefore, the second lead wire 62 is easily connected to the second exposed portion 82f.

As shown in FIG. 6, the sensor case 51 includes a first guide convex part 51i and a pair of second guide convex parts 51j. The first guide convex part 51i and the pair of second guide convex parts 51j are provided in the first terminal housing portion 51b and the second terminal housing portion 51c. The guide convex parts provided in the first terminal housing portion 51b and the guide convex parts provided in the second terminal housing portion 51c are the same except that housing portions provided are different. Therefore, in the following description, the first guide convex part 51i and the second guide convex part 51j provided in the first terminal housing portion 51b will be described as representative.

The first guide convex part 51i projects from the top wall 52e to the upper side. The first guide convex part 51i is disposed at the center of the top wall 52e in the third direction D3. The first guide convex part 51i extends in the first direction D1. The pair of second guide convex parts 51j projects from the pair of side walls 52c to the upper side. The second guide convex part 51j extends in the first direction D1. The first guide convex part 51i is disposed between the pair of second guide convex parts 51j in the third direction D3. Although not shown, a part of the first lead wire 61 is disposed between the first guide convex part 51i and one of the second guide convex parts 51j. A part of the third lead wire 63 is disposed between the first guide convex part 51i and the other of the second guide convex parts 51j. Therefore, a movement of the first lead wire 61 and the third lead wire 63 in the third direction D3 is prevented. Thereby, the first lead wire 61 and the third lead wire 63 are easily connected to the exposed portions. In addition, a gap between the first lead wire 61 and the third lead wire 63 can be insulated by the first guide convex part 51i. Here, in FIG. 4, the first guide convex part 51i and the second guide convex part 51j are not shown.

While the pressure sensor device 50 shown in FIG. 7 is fixed to the pump body 31, oil flowing from the detection oil path 93 into the sensor housing recess 37 flows in the detection hole 58a. More specifically, oil flowing from the detection oil path 93 into the lower side recess 58b of the lower side cover 58 flows in the detection hole 58a. Since the upper end of the detection hole 58a is blocked by the sensor chip 55, oil flowing into the detection hole 58a comes in contact with the sensor chip 55. Thereby, the sensor chip 55 detects a pressure of oil flowing from the detection hole 58a. In this manner, a pressure of oil in the electrically powered pump 10 can be measured using the pressure sensor device 50.

In the present embodiment, since the O-ring 71 that seals a gap between the lower side cover 58 and the pump body 31 is disposed in the lower side recess 58b, it is possible to prevent oil flowing into the lower side recess 58b from leaking to the outside of the sensor housing recess 37. In addition, since a sealing component (not shown) covering the sensor chip 55 is disposed in the housing space 72, it is possible to prevent metal parts such as the sensor chip 55 and the chip terminal 55b from being oxidized (corroded).

Here, the sensor chip 55 may indirectly detect a pressure of oil through, for example, a diaphragm. In this case, the upper end of the detection hole 58a is blocked by the diaphragm, and the sensor chip 55 is disposed in contact with the diaphragm from the upper side. Thereby, the sensor chip 55 can detect a pressure of oil flowing into the detection hole 58a through the diaphragm.

In addition, an angle θ formed by the first direction D1 and the second direction D2 may be an acute angle, a right angle, or a straight angle. In addition, the first direction D1 and the second direction D2 may be directions parallel to the horizontal direction HD.

In addition, the first upper side opening 71a and the first lower side opening 71b may not communicate with each other. The second upper side opening 72a and the second lower side opening 72b may not communicate with each other. In addition, the number of terminals may be two or three. In addition, the first capacitor 85 and the second capacitor 86 may not be provided.

Here, the pressure sensor device of the present invention is not limited to the electrically powered pump 10 that pressurizes and circulates oil according to the above embodiment as long as it is an electrically powered pump that circulates a fluid, and can be applied to any electrically powered pump.

In addition, the above configurations can be appropriately combined within a range in which they are not mutually exclusive.

Priority is claimed on Japanese Patent Application No. 2016-147531, filed Jul. 27, 2016, the content of which is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A pressure sensor device for an electrically powered pump, the pressure sensor device comprising:
   a pressure sensor to measure a pressure of a fluid inside the electrically powered pump;
   a first terminal that projects from the pressure sensor in a first direction that extends to one side in a horizontal direction;
   a second terminal that projects from the pressure sensor in a second direction that extends to another side in the horizontal direction;
   a third terminal that projects from the pressure sensor in the first direction;
   a sensor case that houses the pressure sensor;
   a first capacitor that is disposed on one side of the pressure sensor in the horizontal direction and is connected between the first terminal and the third terminal;
   a first lead wire that is electrically connected to the first terminal;
   a second lead wire that is electrically connected to the second terminal; and
   a third lead wire that is electrically connected to the third terminal; wherein
   the sensor case includes:
      a sensor housing portion that houses the pressure sensor;
      a first terminal housing portion that extends from the sensor housing portion in the first direction and houses the first terminal; and a second terminal housing portion that extends from the sensor housing portion in the second direction and houses the second terminal;

the first terminal housing portion includes a first upper side opening that opens to the upper side and a first lower side opening that opens to the lower side;

the second terminal housing portion includes a second upper side opening that opens to the upper side and a second lower side opening that opens to the lower side;

the first terminal includes a first exposed portion including an upper surface exposed to outside of the first terminal housing portion through the first upper side opening and a lower surface exposed to outside of the first terminal housing portion through the first lower side opening;

the second terminal includes a second exposed portion including an upper surface exposed to the outside of the second terminal housing portion through the second upper side opening and a lower surface exposed to the outside of the second terminal housing portion through the second lower side opening;

the first exposed portion includes a first lead wire connection portion to which the first lead wire is connected;

the second exposed portion includes a second lead wire connection portion to which the second lead wire is connected;

the first terminal housing portion houses the third terminal;

the third terminal includes a third exposed portion including an upper surface exposed to outside of the first terminal housing portion through the first upper side opening and a lower surface exposed to the outside of the first terminal housing portion through the first lower side opening;

the first exposed portion includes a first capacitor connection portion to which the first capacitor is connected;

the third exposed portion includes a third lead wire connection portion to which the third lead wire is connected and a third capacitor connection portion to which the first capacitor is connected;

the first capacitor connection portion is disposed at a position different from that of the first lead wire connection portion in the first direction; and the third capacitor connection portion is disposed at a position different from that of the third lead wire connection portion in the first direction.

2. The pressure sensor device according to claim 1, further comprising:

a fourth terminal that projects from the pressure sensor in the second direction and is electrically connected to the third terminal; and a second capacitor that is disposed on another side of the pressure sensor in the horizontal direction and is connected between the second terminal and the fourth terminal; wherein the second terminal housing portion houses the fourth terminal;

the fourth terminal includes a fourth exposed portion including an upper surface exposed to outside of the second terminal housing portion through the second upper side opening and a lower surface exposed to outside of the second terminal housing portion through the second lower side opening;

the second exposed portion includes a second capacitor connection portion to which the second capacitor is connected;

the fourth exposed portion includes a fourth capacitor connection portion to which the second capacitor is connected; and the second capacitor connection portion is disposed at a position different from that of the second lead wire connection portion in the second direction.

3. The pressure sensor device according to claim 1, wherein the first lead wire connection portion is provided on one of the upper surface of the first exposed portion and the lower surface of the first exposed portion; and the first capacitor connection portion is provided on another of the upper surface of the first exposed portion and the lower surface of the first exposed portion.

4. The pressure sensor device according to claim 3, wherein the first lead wire connection portion is disposed on the side of the pressure sensor in the first direction with respect to the first capacitor connection portion.

5. The pressure sensor device according to claim 3, wherein a lower surface of the sensor case includes an installation surface that comes in contact with an installation portion of the electrically powered pump;

the first lead wire connection portion is provided on an upper surface of the first exposed portion; and the first capacitor connection portion is provided on a lower surface of the first exposed portion.

6. The pressure sensor device according to claim 3, wherein a distance from a lower end of the first lower side opening to the lower surface of the first exposed portion in a vertical direction is larger than a distance from an upper end of the first upper side opening to the upper surface of the first exposed portion in the vertical direction.

7. The pressure sensor device according to claim 1, wherein the upper surface of the first exposed portion and the upper surface of the third exposed portion are exposed through one of the first upper side openings; and the lower surface of the first exposed portion and the lower surface of the third exposed portion are exposed through one of the first lower side openings.

8. The pressure sensor device according to claim 1, wherein the first terminal housing portion includes a first capacitor holder that holds the first capacitor.

9. The pressure sensor device according to claim 1, wherein the first lead wire includes:

a first lead wire main body; and a first connection metal fitting that is fixed to a tip of the lead wire main body and connected to the first lead wire connection portion and extends in the first direction; wherein the first connection metal fitting includes a first convex portion that projects toward the pressure sensor in the first direction; and the sensor case has a first recess that is recessed toward the pressure sensor in the first direction and into which the first convex portion is inserted.

10. The pressure sensor device according to claim 1, wherein an angle defined by the first direction and the second direction is an obtuse angle.

11. An electrically powered pump comprising:

a shaft that rotates around a central axis;

a motor that rotates the shaft;

a pump that is connected to the shaft and driven via the shaft that is rotated by the motor;
the pressure sensor device according to claim 1; wherein
the first terminal is disposed on one side of the pressure sensor in a circumferential direction;
the second terminal is disposed on another side of the pressure sensor in the circumferential direction; and
the pressure sensor device is disposed in the electrically powered pump.

* * * * *